(12) United States Patent
Kawasaki et al.

(10) Patent No.: US 7,687,368 B2
(45) Date of Patent: Mar. 30, 2010

(54) SEMICONDUCTOR DEVICE MANUFACTURING METHOD

(75) Inventors: Hirohisa Kawasaki, Yokohama (JP);
Kazunari Ishimaru, Yokohama (JP);
Kunihiro Kasai, Yokohama (JP);
Yasunori Okayama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1135 days.

(21) Appl. No.: 11/088,885

(22) Filed: Mar. 25, 2005

(65) Prior Publication Data

US 2005/0282354 A1   Dec. 22, 2005

(30) Foreign Application Priority Data

Jun. 18, 2004   (JP) ............................. 2004-181076

(51) Int. Cl.
*H01L 21/76* (2006.01)
(52) U.S. Cl. ............................. 438/412; 257/E21.554
(58) Field of Classification Search ............... 438/42, 438/424, FOR. 227, 770, 149, 439, 635, 773, 438/404, 405, 410, 415, 422, 425, 427, 432, 438/412; 257/19, 250, E21.554, E21.663, 257/E21.21, E21.552, E21.218, E21.566, 257/E21.571, E21.55, E21.565, E21.564
See application file for complete search history.

(56) References Cited

U.S. PATENT DOCUMENTS

| | | | | |
|---|---|---|---|---|
| 4,361,600 A | * | 11/1982 | Brown | 438/410 |
| 4,604,162 A | * | 8/1986 | Sobczak | 438/410 |
| 5,266,813 A | | 11/1993 | Comfort et al. | |
| 5,635,411 A | * | 6/1997 | Takasu | 438/311 |
| 5,691,230 A | * | 11/1997 | Forbes | 438/412 |
| 5,963,817 A | * | 10/1999 | Chu et al. | 438/410 |
| 6,143,190 A | * | 11/2000 | Yagi et al. | 216/27 |
| 6,174,784 B1 | * | 1/2001 | Forbes | 438/405 |
| 6,251,751 B1 | * | 6/2001 | Chu et al. | 438/439 |
| 6,277,703 B1 | * | 8/2001 | Barlocchi et al. | 438/412 |
| 6,350,657 B1 | * | 2/2002 | Mastromatteo et al. | 438/311 |
| 6,414,364 B2 | * | 7/2002 | Lane et al. | 257/397 |
| 6,600,170 B1 | * | 7/2003 | Xiang | 257/18 |
| 6,607,948 B1 | * | 8/2003 | Sugiyama et al. | 438/151 |

(Continued)

FOREIGN PATENT DOCUMENTS

JP   63-308933   12/1988

(Continued)

OTHER PUBLICATIONS

Notification of Reasons for Rejection mailed Oct. 27, 2009, in corresponding Japanese Patent Application No. 2004-181076, and English-language translation thereof.

*Primary Examiner*—W. David Coleman
*Assistant Examiner*—Latanya Crawford
(74) *Attorney, Agent, or Firm*—Finnegan, Henderson, Farabow, Garrett & Dunner, L.L.P.

(57) ABSTRACT

A semiconductor device manufacturing method is disclosed. The method is to form a second semiconductor layer which has less susceptibility to adopting insulative characteristics than a first semiconductor layer on the first semiconductor layer. Then, grooves which expose portions of the second and first semiconductor layers are formed to extend from the upper surface of the second semiconductor layer into the first semiconductor layer. Next, portions of the first and second semiconductor layers which are exposed to the grooves are changed into an insulator form to fill the grooves with the insulator-form portions of the first semiconductor layer.

14 Claims, 23 Drawing Sheets

U.S. PATENT DOCUMENTS

| | | | |
|---|---|---|---|
| 6,627,515 B1* | 9/2003 | Tseng et al. | 438/439 |
| 6,716,718 B2* | 4/2004 | Nagatani et al. | 438/424 |
| 6,720,233 B2* | 4/2004 | Muth | 438/404 |
| 6,797,547 B2* | 9/2004 | Haynie et al. | 438/149 |
| 6,846,720 B2* | 1/2005 | Balasubramanian et al. | 438/424 |
| 6,891,209 B2* | 5/2005 | Bulsara et al. | 257/222 |
| 7,211,474 B2* | 5/2007 | Cheng et al. | 438/153 |
| 7,262,428 B2* | 8/2007 | Forbes | 257/19 |
| 2002/0094665 A1* | 7/2002 | Villa et al. | 438/479 |
| 2002/0182787 A1* | 12/2002 | Bae | 438/149 |
| 2003/0049893 A1* | 3/2003 | Currie et al. | 438/172 |
| 2004/0171223 A1* | 9/2004 | Hammond et al. | 438/285 |
| 2005/0087803 A1* | 4/2005 | Hara et al. | 257/347 |

FOREIGN PATENT DOCUMENTS

| | | |
|---|---|---|
| JP | 1-287942 | 11/1989 |
| JP | 3-89532 | 4/1991 |
| JP | 5-291395 | 11/1993 |
| JP | 11-284065 | 10/1999 |

* cited by examiner

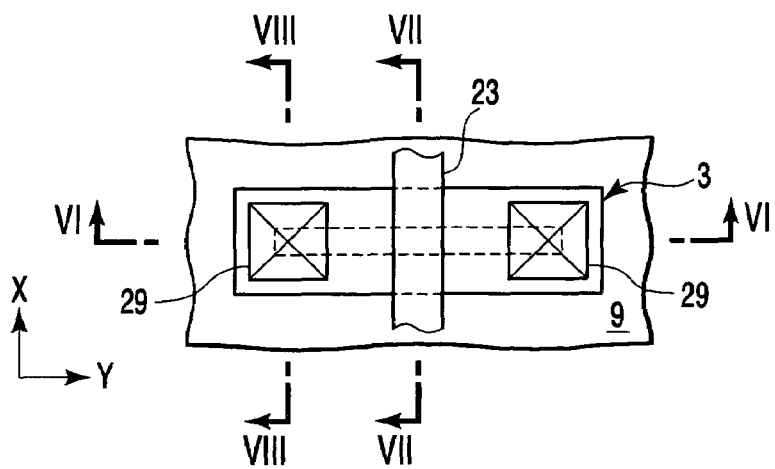
F I G. 5
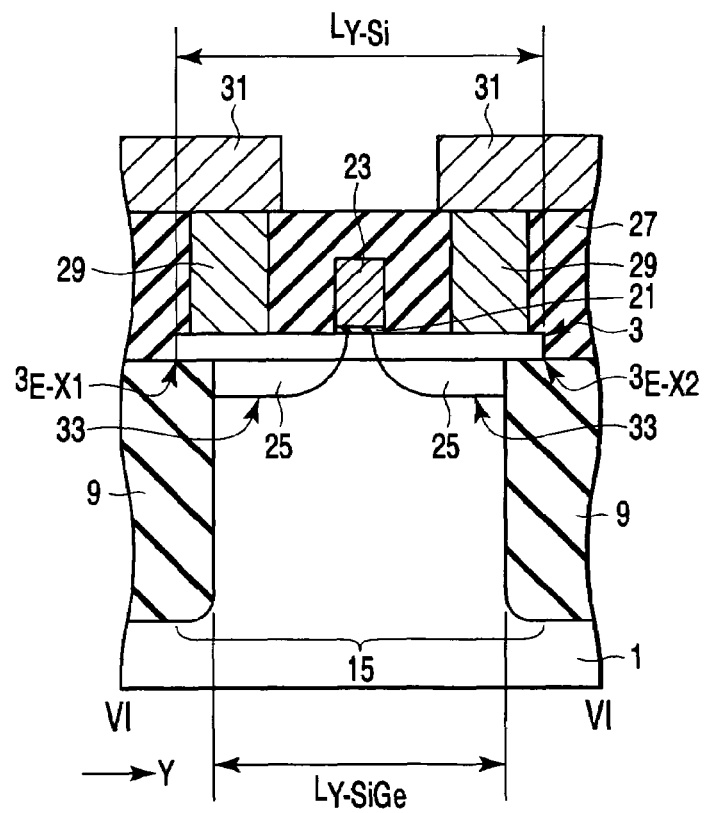
F I G. 6

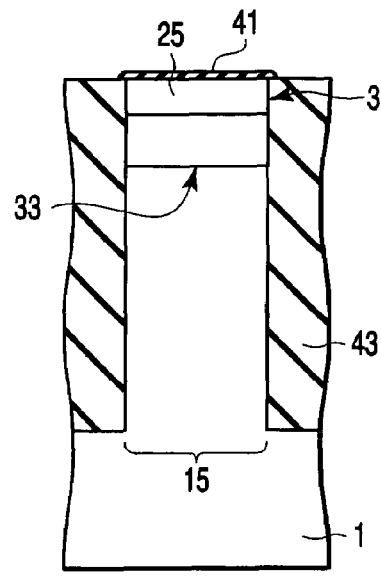
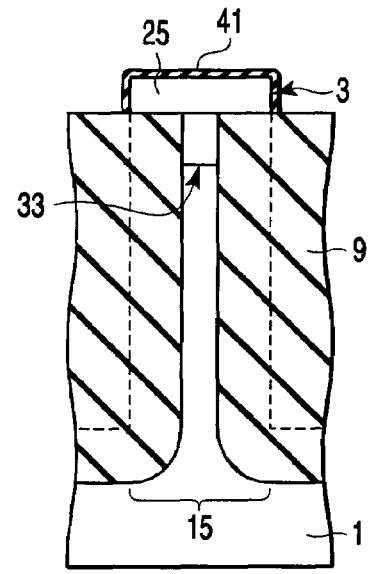
Reference example
FIG. 9A          FIG. 9B
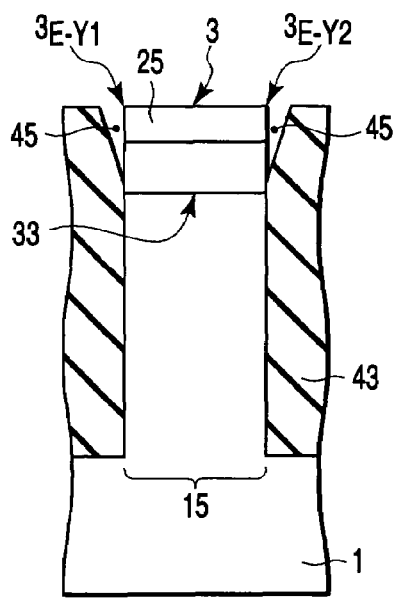
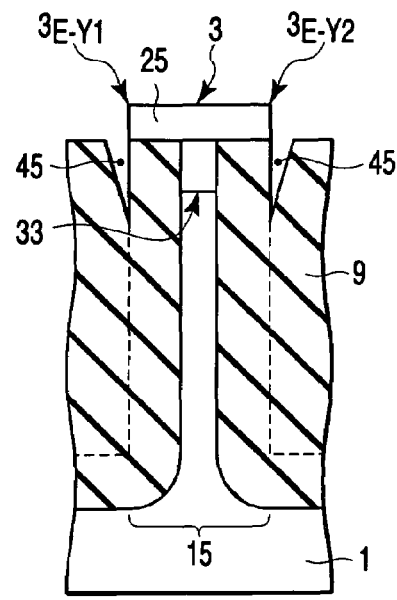
Reference example
FIG. 10A        FIG. 10B

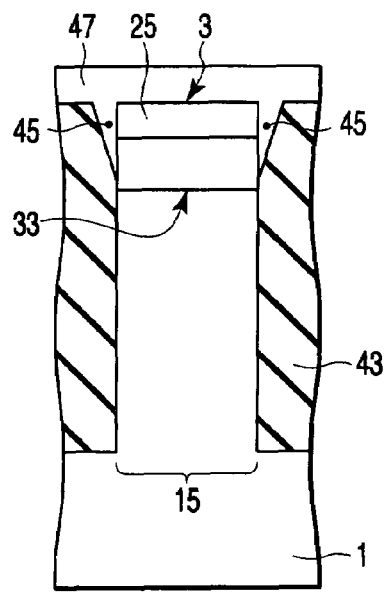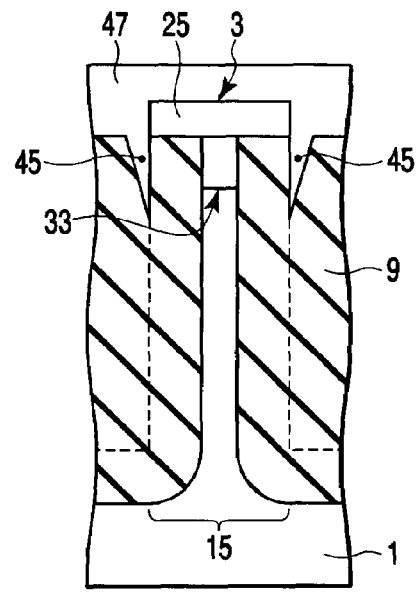
FIG.11A  Reference example
FIG.11B
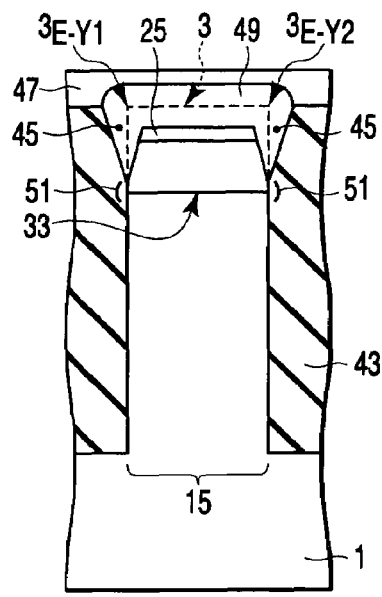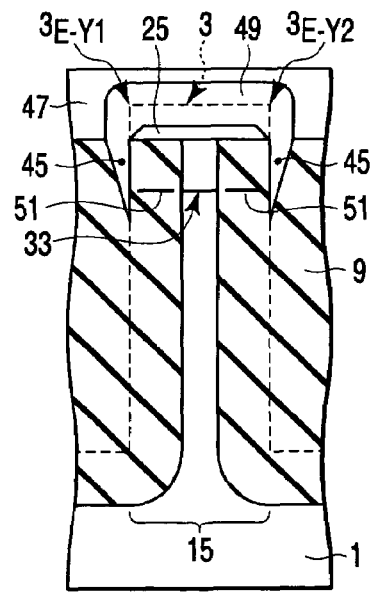
FIG.12A  Reference example
FIG.12B

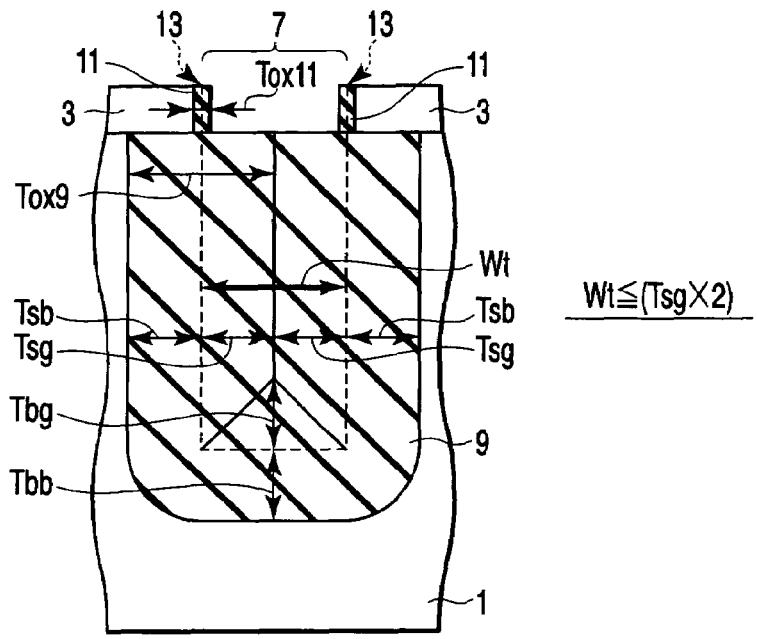
F I G. 1 3
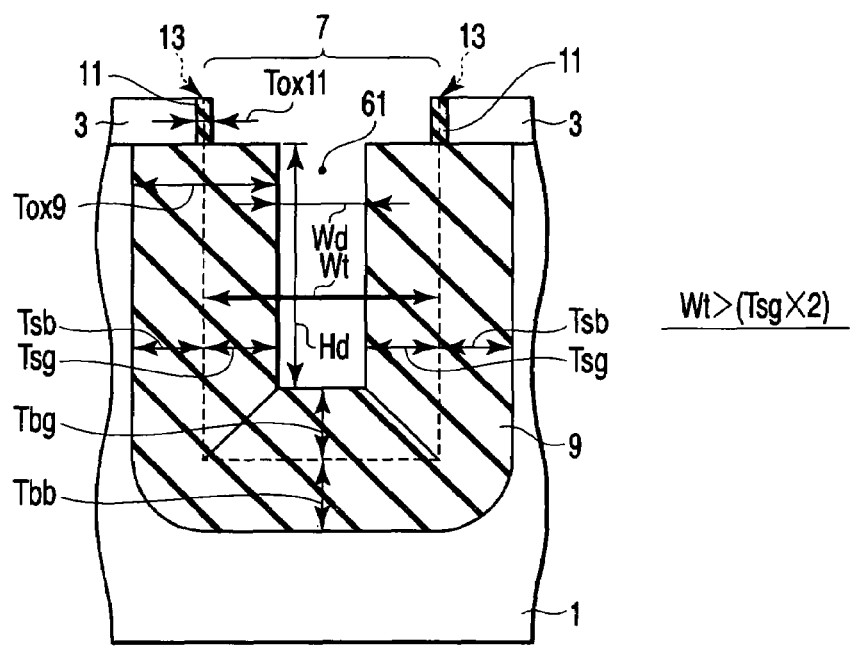
F I G. 1 4

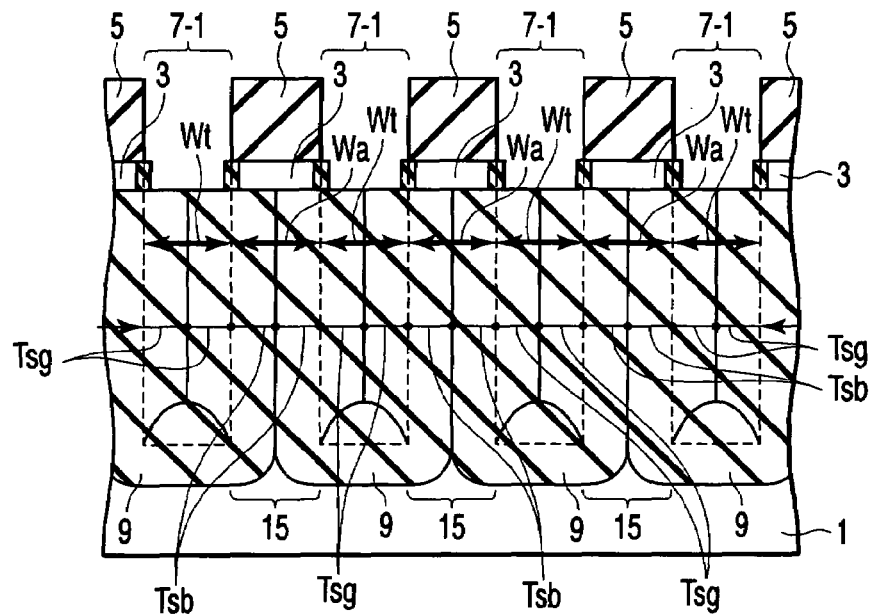
F I G. 29
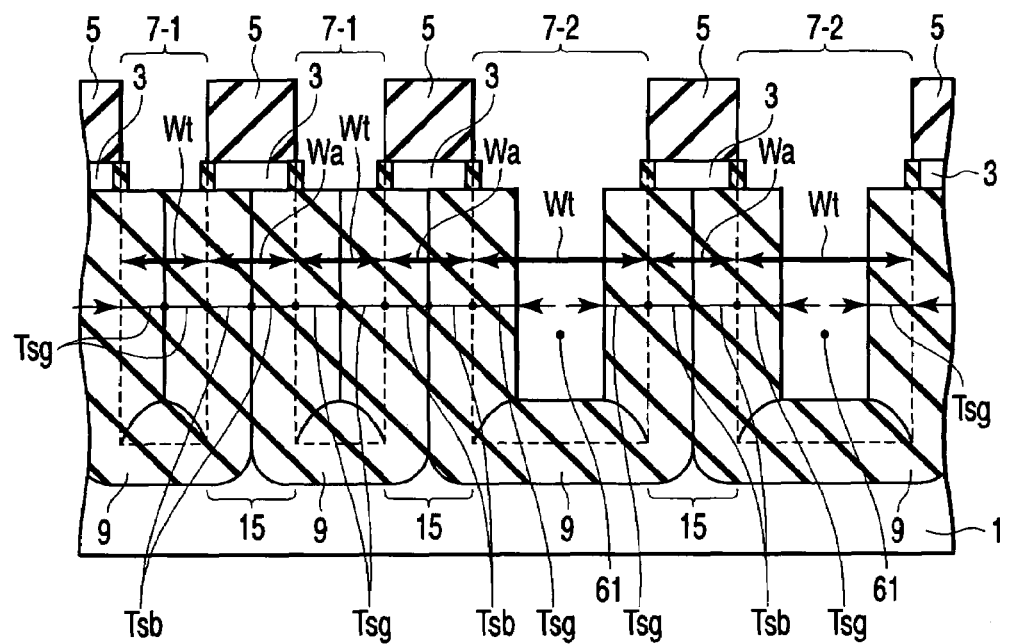
F I G. 30

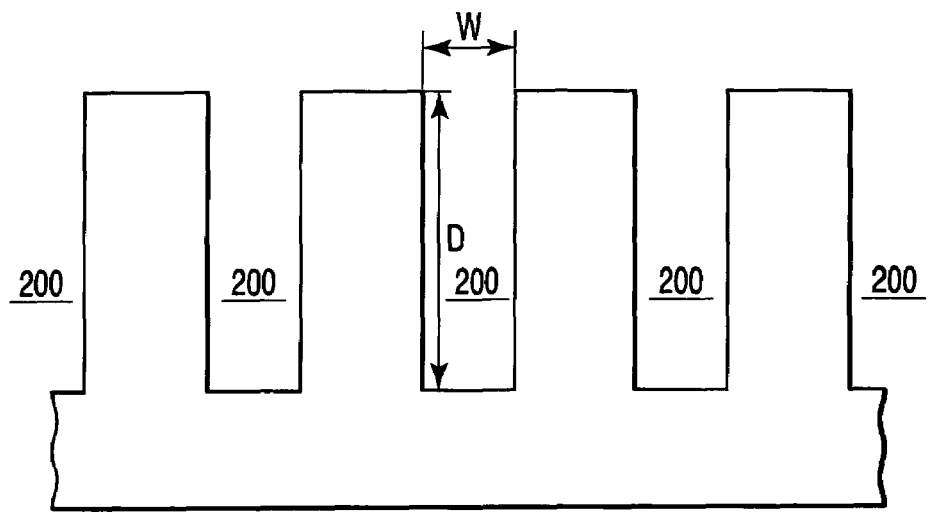
F I G. 4 1
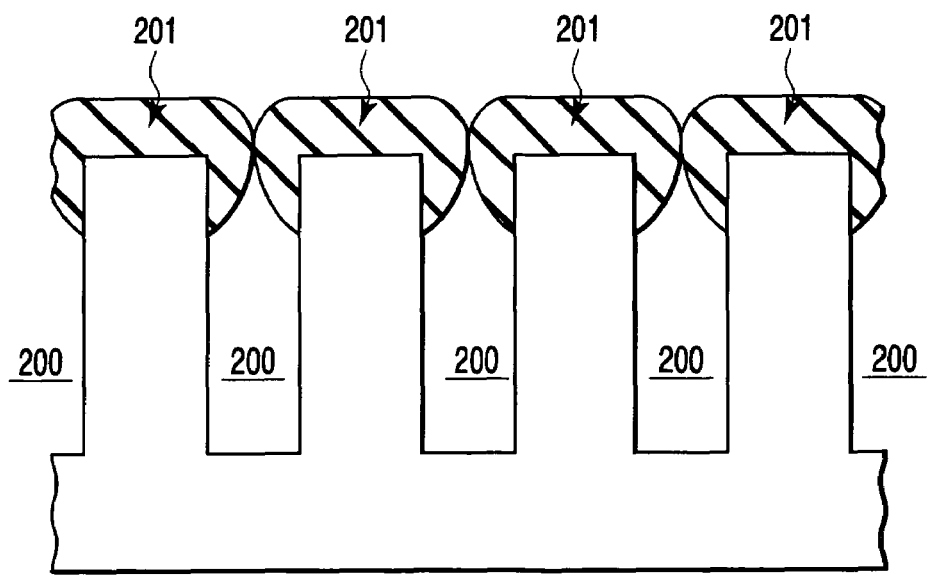
F I G. 4 2

US 7,687,368 B2

SEMICONDUCTOR DEVICE MANUFACTURING METHOD

CROSS-REFERENCE TO RELATED APPLICATIONS

This application is based upon and claims the benefit of priority from prior Japanese Patent Application No. 2004-181076, filed Jun. 18, 2004, the entire contents of which are incorporated herein by reference.

BACKGROUND OF THE INVENTION

1. Field of the Invention

This invention relates to a semiconductor device manufacturing method and more particularly to a manufacturing method of a semiconductor device having fine trench isolation.

2. Description of the Related Art

In recent years, as an element isolation region of a semiconductor device, a shallow trench isolation (STI) region is widely used instead of a local oxidation (LOCal Oxidation of Silicon: LOCOS) type element isolation region. The STI region is less subject to mask conversion errors since the "bird's beak" is not grown, unlike the LOCOS region. Further, in the STI region, the isolation region can be formed deeper and the isolation distance between the adjacent active regions can be made large in comparison with the LOCOS region. A semiconductor device having the LOCOS type element isolation region is described in U.S. Pat. No. 5,963,817, for example.

The STI region is advantageous for miniaturization, but some difficult conditions occur when the semiconductor device is further miniaturized.

One of the problems is that the aspect ratio of the STI region becomes higher. The aspect ratio is the ratio of the vertical length to the width of a trench and, for example, it is a value of a fraction using the opening diameter W of a trench 200 as a denominator and the depth D thereof as a numerator as shown in FIG. 41. As the aspect ratio D/W increases, the cross section of the trench becomes a long narrow shape.

In order to further miniaturize the semiconductor device, it is necessary to reduce the width of the STI region, that is, the opening diameter W. At the same time, in order to compensate for an isolation distance between active regions which is reduced by reducing the opening diameter W, it is necessary to make larger the depth of the STI region, that is, the depth D of the trench. As a result, the aspect ratio of the STI region becomes higher.

In the STI region with the enhanced aspect ratio or the STI region having the opening diameter reduced, one of the difficult conditions is that it becomes difficult to fill the trench with an insulating material. For example, as shown in FIG. 42, insulating materials 201 overhang the trenches 200 to cover the openings of the trenches 200. If the openings of the trenches 200 are thus covered and closed, it becomes impossible to deposit the insulating materials 201 in the trenches 200 to make the STI structure incomplete.

Reference Document: U.S. Pat. No. 5,963,817

BRIEF SUMMARY OF THE INVENTION

A semiconductor device manufacturing method according to a first aspect of the present invention comprises forming a second semiconductor layer which has less susceptibility to adopting insulative characteristics than a first semiconductor layer on the first semiconductor layer, forming grooves in the first and second semiconductor layers, and changing portions of the first and second semiconductor layers which are exposed to the grooves into an insulator form to fill the grooves with the insulator-form portions of the first semiconductor layer.

A semiconductor device manufacturing method according to a second aspect of the present invention comprises forming a second semiconductor layer which has less susceptibility to adopting insulative characteristics than a first semiconductor layer on the first semiconductor layer, forming grooves in the first and second semiconductor layers and form fin-shaped semiconductor structures which are each sandwiched between the grooves, and changing portions of the first and second semiconductor layers which are exposed to the grooves into an insulator form to fill the grooves with the insulator-form portions of the first semiconductor layer, narrow the width of a portion of the first semiconductor layer which lies in each of the fin-shaped semiconductor structures by use of the insulator-form portion of the first semiconductor layer and cause the second semiconductor layer to overhang the insulator-form portion of the first semiconductor layer.

A semiconductor device manufacturing method according to a third aspect of the present invention comprises forming a second semiconductor layer which has less susceptibility to adopting insulative characteristics than a first semiconductor layer on the first semiconductor layer, forming grooves in the first and second semiconductor layers and form fin-shaped semiconductor structures which are each sandwiched between the grooves, and changing portions of the first and second semiconductor layers which are exposed to the grooves into an insulator form to fill the grooves with the insulator-form portions of the first semiconductor layer, cover the first semiconductor layer in each of the fin-shaped semiconductor structures with the insulator-form portion of the first semiconductor layer and isolate the second semiconductor layer on the insulator-form portion of the first semiconductor layer.

BRIEF DESCRIPTION OF THE SEVERAL VIEWS OF THE DRAWING

FIG. 5 is a plan view showing one example of a semiconductor device manufactured by use of the manufacturing method according to the first embodiment;

FIG. 6 is a cross sectional view taken along the VI-VI line of FIG. 5;

FIGS. 9A and 9B are cross sectional views showing one example of formation of a silicide layer;

FIGS. 10A and 10B are cross sectional views showing one example of formation of a silicide layer;

FIGS. 11A and 11B are cross sectional views showing one example of formation of a silicide layer;

FIGS. 12A and 12B are cross sectional views showing one example of formation of a silicide layer;

FIG. 13 is a cross sectional view showing a first example of the width of a trench;

FIG. 14 is a cross sectional view showing a second example of the width of a trench;

FIG. 29 is a cross sectional view showing a first example of a semiconductor device according to a fourth embodiment of this invention;

FIG. 30 is a cross sectional view showing a second example of the semiconductor device according to the fourth embodiment of this invention;

FIG. 41 is a diagram showing the aspect ratio; and

FIG. 42 is a diagram showing a state in which the trenches are covered.

DETAILED DESCRIPTION OF THE INVENTION

At present, an insulating material which can be used to attain excellent step coverage and a manufacturing method thereof are developed and the technique for filling insulating materials into trenches with relatively high aspect ratio is provided. For example, the insulating material is silicon dioxide obtained by use of a CVD (Chemical Vapor Deposition) method utilizing TEOS (Tetraethylorthosilicate) as a reactant source and utilizing ozone ($O_3$) as an oxidizer.

Even if an insulating material which can be used to attain excellent step coverage or a manufacturing method capable of attaining excellent step coverage is used, trenches are three-dimensional spaces arranged in a complicated form in a semiconductor wafer. In addition, the aspect ratio of the three-dimensional space will be further enhanced and the diameter of the opening further reduced in future. It will therefore become extremely difficult to deposit the insulating material in a conformal form in the three-dimensional space.

There will now be described embodiments of this invention with reference to the accompanying drawings. In this explanation, common reference symbols are attached to like portions throughout the drawings.

First Embodiment

FIGS. 1 to 4 are cross sectional views showing one example of a semiconductor device manufacturing method according to a first embodiment of this invention.

Figure 1:
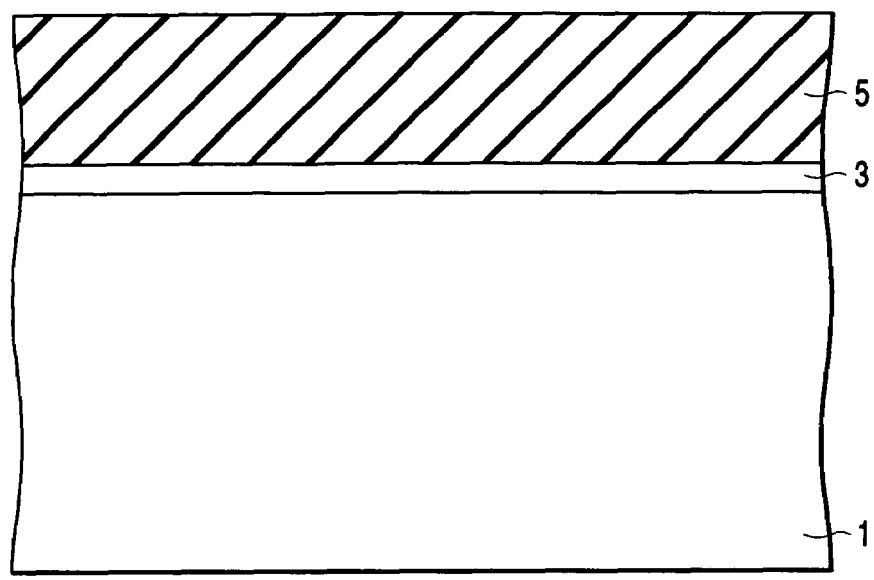
FIG. 1 is a cross sectional view showing one example of a step of a semiconductor device manufacturing method according to a first embodiment of this invention.

As shown in FIG. 1, a second semiconductor layer 3 is formed on a first semiconductor layer 1. One example of the first semiconductor layer is a semiconductor substrate, that is, a semiconductor wafer and one concrete example of the second semiconductor layer 3 is a layer formed with thin film thickness on the surface of the semiconductor substrate or a thin film deposited to thin film thickness on the semiconductor substrate. In this example, the semiconductor material of the second semiconductor layer 3 is selected from semiconductor materials which are more difficult to be changed or modified into an insulator form than the first semiconductor layer 1. One example of the insulation process is oxidation.

In this example, as a material of the first semiconductor layer 1, a semiconductor material containing two or more types of elements, for example, an alloy semiconductor material formed of a solid solution of two or more types of semiconductor elements is selected. Further, as a material of the second semiconductor layer 3, an elemental semiconductor material formed of a single element is selected. However, as long as the second semiconductor layer 3 is less susceptible to adopting insulative characteristics than the first semiconductor layer 1, it is not limited to a laminated structure consisting of an alloy semiconductor material and elemental semiconductor material.

Further, in this example, as the alloy semiconductor material, a material having a lattice constant larger than that of the elemental semiconductor material is selected. By setting the lattice constant of the first semiconductor layer 1 larger than the lattice constant of the second semiconductor layer 1, the lattice spacing of the second semiconductor layer 3 formed on the first semiconductor layer 1 is increased in comparison with a case wherein the second semiconductor layer 3 is formed of a single layer. Thus, a structure which is called a "strained semiconductor or strained channel" structure is obtained. In this specification, the structure is called a "strained semiconductor (strained silicon)" structure. The strained semiconductor structure is a structure of a semiconductor device in which the carrier mobility is enhanced and the operation speed is raised by increasing the lattice spacing of the semiconductor layer. The strained semiconductor is also described in U.S. Pat. No. 5,963,817.

Examples of a materials which satisfy both of the conditions that the second semiconductor layer 3 has less susceptibility to adopting insulative characteristics than the first semiconductor layer 1 and the lattice constant of the first semiconductor layer 1 is larger than the lattice constant of the second semiconductor layer 3 are $Si_XGe_Y$ for the first semiconductor layer 1 and Si for the second semiconductor layer 3. In the following explanation, the first semiconductor layer 1 is called an SiGe substrate 1 and the second semiconductor layer 3 is called an Si layer 3.

As shown in FIG. 1, first, the Si layer 3 is formed on the SiGe substrate 1. For example, the Si layer 3 is formed by forming Si on the SiGe substrate 1 by use of the epitaxial growth method. Then, a mask layer 5 is formed on the Si layer 3. The mask layer 5 is a layer which functions as a hard mask when trenches are formed. In this example, the condition of the mask layer 5 is that a certain etching rate can be adequately set for the SiGe substrate 1 and Si layer 3 and insulation of the upper surface of the Si layer 3, for example, oxidation thereof can be suppressed. One example of a material which satisfies the above condition is $Si_XN_Y$. In the following description, the mask layer 5 is referred to as an SiN layer 5.

Figure 2:
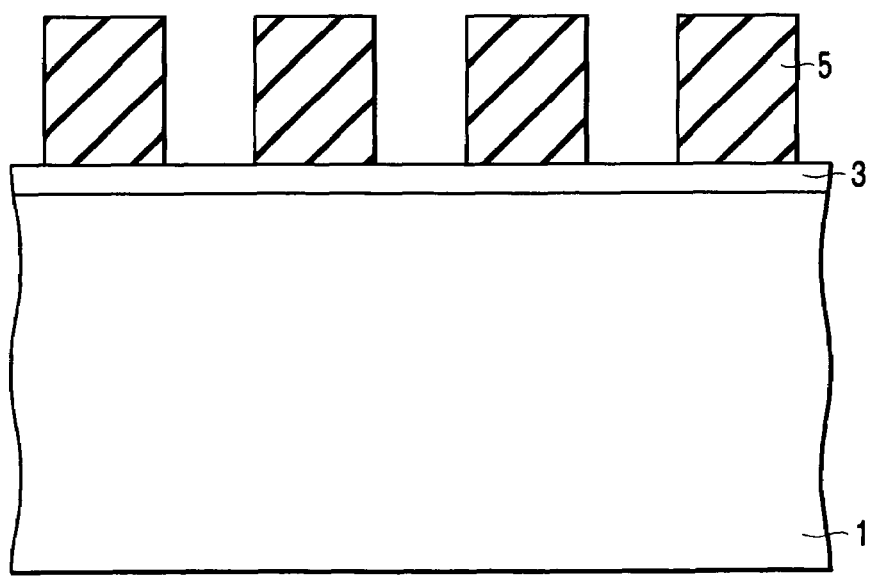
FIG. 2 is a cross sectional view showing one example of a step of the semiconductor device manufacturing method according to the first embodiment of this invention.

Next, as shown in FIG. 2, the SiN layer 5 is formed into a semiconductor active region forming pattern by use of a photolithography method, for example.

Figure 3:
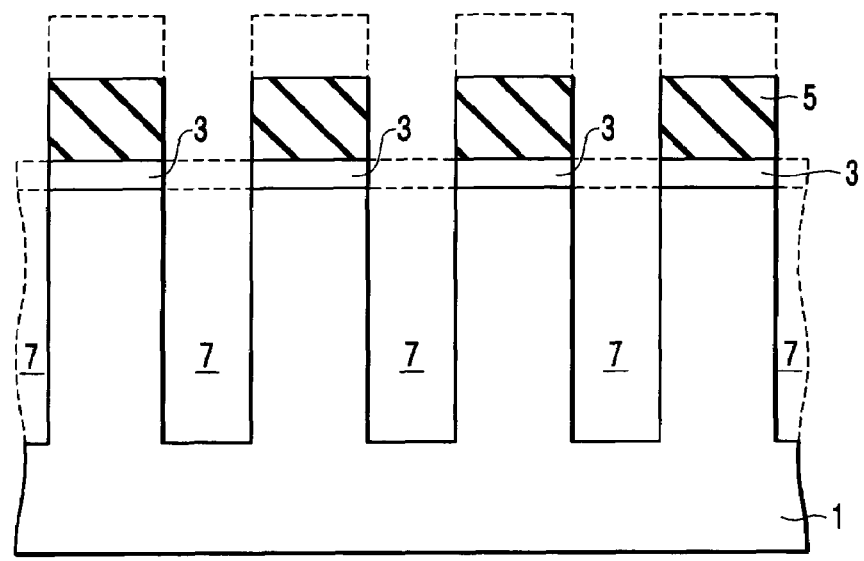
FIG. 3 is a cross sectional view showing one example of a step of the semiconductor device manufacturing method according to the first embodiment of this invention.

Next, as shown in FIG. 3, the Si layer 3 and SiGe substrate 1 are etched by use of an anisotropic etching process, for example, an RIE (Reactive Ion Etching) process, under the conditions that the SiN layer 3 has high etching resistance and the Si layer 3 and SiGe substrate 1 have low etching resistance. As a result, trenches 7 extending from the upper surface of the Si layer 3 to the SiGe substrate 1 are formed. The trench 7 is a three-dimensional space which exposes the Si layer 3 and SiGe substrate 1.

Figure 4:
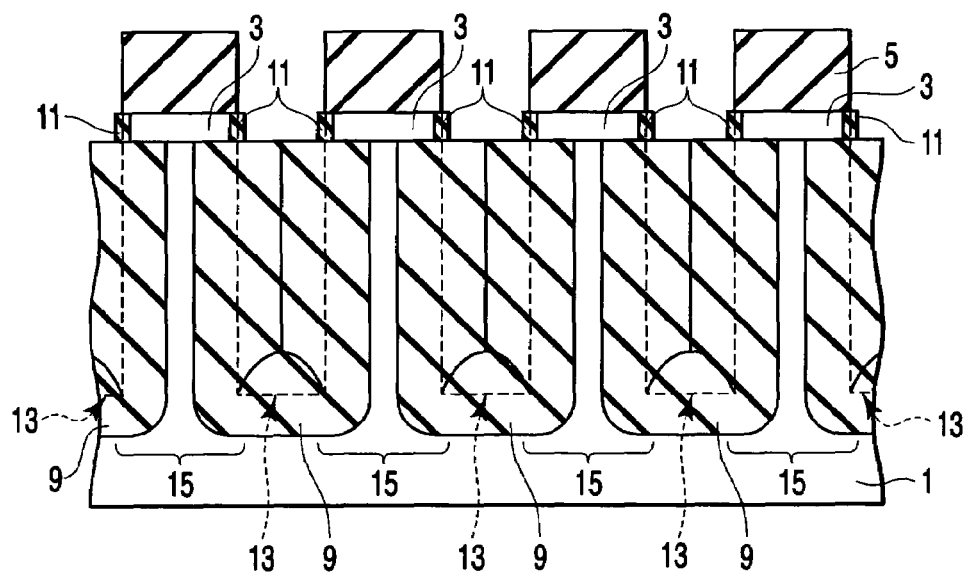
FIG. 4 is a cross sectional view showing one example of a step of the semiconductor device manufacturing method according to the first embodiment of this invention.

Then, as shown in FIG. 4, the exposed surface portions of the Si layer 3 and SiGe substrate 1 are changed into insulating portions, for example, oxidized. The SiGe substrate 1 is more easily oxidized than the Si layer 3. Therefore, SiGe oxides 9 grow towards the three-dimensional spaces or the trenches 7 in this example to a larger extent in comparison with Si oxides 11. As the result of growth, each of the trenches 7 is filled with the SiGe oxide 9. Since SiGe has a property that makes it more easily oxidized than Si, any method can be used as the oxidation method. One example of the oxidation method is a hydrochloric acid oxidation method. The hydrochloric acid oxidation method utilizes an oxidation atmosphere containing water vapor and hydrochloric acid. It is confirmed by the inventor of this application that the oxidation rate of SiGe is 30 times or more the oxidation rate of Si when hydrochloric acid is used. More specifically, SiGe is oxidized to a thickness of approximately 200 nm when Si is oxidized to a thickness of approximately 6 nm. Since the hydrochloric acid oxidation method is performed to rapidly oxidize SiGe in comparison with Si, for example, the time required for filling the trench 7 with the SiGe oxide 9 can be reduced. Further, since the ratio of the SiGe oxidation rate to the Si oxidation rate can be set large, for example, it can be set to 30 or more, a reduction in the size of the Si layer 3 by oxidation can be suppressed to a minimum. Based on the above advantages, the hydrochloric acid oxidation method can be said to be one of the practical oxidation methods when embodying this invention.

The SiGe oxide 9 grows from the exposed surface 13 towards the trench 7 and, at the same time, it is set back from the exposed surface 13 into a fin-shaped semiconductor structure, for example, semiconductor active region 15 sandwiched between the trenches 7 of SiGe. Likewise, the Si oxide 11 grows from the exposed surface 13 towards the trench 7 and, at the same time, it is set back into the semiconductor active region 15. Since the setback speed of the SiGe oxide 9 is higher than the setback speed of the Si oxide 11, the cross sectional shape of the semiconductor active region 15 becomes a so-called "T-shaped" configuration in which a portion of the Si layer 3 is wide and a portion of the SiGe substrate 1 is narrow.

In the semiconductor device manufacturing method according to the first embodiment, the Si layer (second semiconductor layer) 3 which has less susceptibility to adopting insulative characteristics, for example, due to oxidation, than the SiGe substrate 1, is formed on the SiGe substrate (first semiconductor layer) 1 and the three-dimensional spaces, for example, trenches 7 which expose the Si layer 3 and SiGe substrate 1 are formed. After this, portions of the SiGe substrate 1 and Si layer 3 which are exposed to the trenches 7 are changed into insulating portions, for example, by oxidation. Since the growing speed of the SiGe oxide 9 is higher than the growing speed of the Si oxide 11, the trenches 7 are filled with the SiGe oxides 9. As a result, even if the semiconductor device is further miniaturized and the aspect ratio of the three-dimensional space or the trench 7 is increased or the opening diameter is reduced, the trench 7 can be filled with the insulating material or SiGe oxide in this example.

The SiGe oxide 9 and Si oxide 11 grow towards the trench 7 and, at the same time, they are set back into the fin-shaped semiconductor structure, for example, semiconductor active region 15. Since the setback speed of the Si oxide 11 is lower than the setback speed of the SiGe oxide 9, the setback of the Si layer 3 due to oxidation is suppressed. The Si layer 3 is a channel portion of an MISFET (Metal Insulator Semiconductor Field Effect Transistor), for example. If the setback of the channel portion of the semiconductor active region 15 is suppressed, for example, a reduction in the channel width can be suppressed. Therefore, a reduction in the driving ability of the MISFET can be suppressed.

Further, the number of steps can be reduced. In the case of a typical STI structure, it is necessary to form trenches, fill the trenches with an insulating material and make flat the surface of the filled insulating material by use of a CMP (Chemical Mechanical Polishing) method or the like, for example. In the above manufacturing method, an STI structure can be attained by forming trenches 7 and changing the exposed surface portions of the Si layer 3 and SiGe substrate 1 exposed to the trenches 7 into insulating portions or oxidizing the same.

A difference in level substantially corresponding to the thickness of the Si layer 3 occurs between the upper surface of the Si layer 3 and the upper surface of the SiGe oxide 9. However, a conductive material used to form gate electrodes, for example, a conductive polysilicon material is not broken at the stepped portion with a difference in level corresponding to the thickness of the Si layer 3, it is of course possible to omit the burying step of burying the stepped portion between the Si layer 3 and the SIGe oxide and the flattening step of making flat the buried material.

Thus, according to the semiconductor device manufacturing method of the first embodiment, a semiconductor device manufacturing method capable of further miniaturizing the semiconductor device can be attained.

FIG. 5 is a plan view showing one example of a semiconductor device manufactured by use of the manufacturing method according to the first embodiment. FIG. 6 is a cross sectional view taken along the VI-VI line of FIG. 5, FIG. 7 is a cross sectional view taken along the VII-VII line of FIG. 5 and FIG. 8 is a cross sectional view taken along the VIII-VIII line of FIG. 5.

A semiconductor device according to this example is a transistor and indicates a MISFET, for example, MOSFET (Metal Oxide Semiconductor Field Effect Transistor). Of course, the semiconductor device manufactured by use of the manufacturing method according to the first embodiment is not limited to this example.

As shown in FIGS. 5 to 8, a semiconductor active region 15 includes an SiGe substrate 1 and Si layers 3 formed on the SiGe substrate 1. The conductivity types of the SiGe substrate 1 and Si layer 3 are set to a P type, for example. The shape of the active region 15 is a fin shape.

Figure 7:
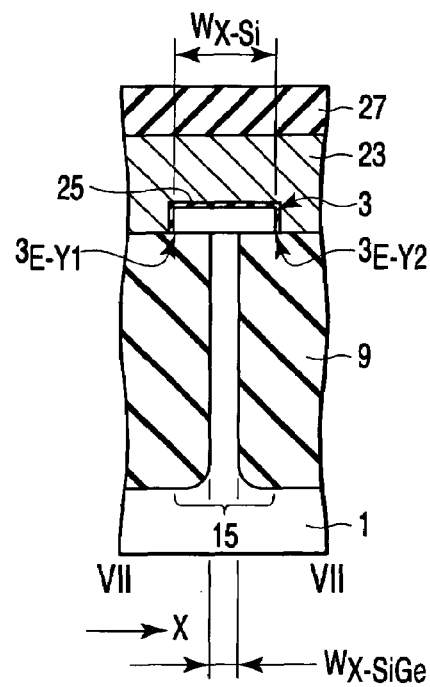
FIG. 7 is a cross sectional view taken along the VII-VII line of FIG. 5.
Figure 8:
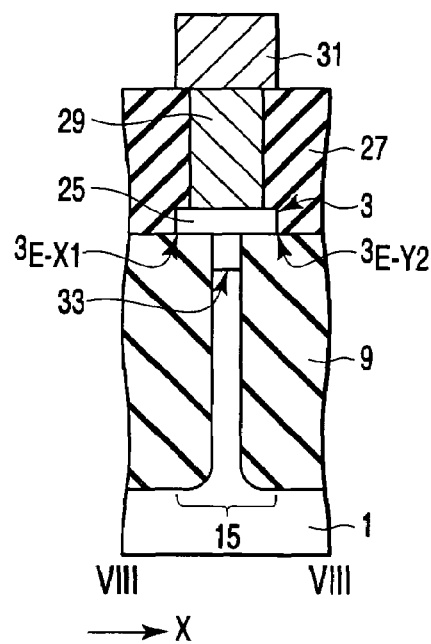
FIG. 8 is a cross sectional view taken along the VIII-VIII line of FIG. 5.

In the fin-shaped active region 15, the length Ly-Si of the Si layer 3 along the Y direction is larger than the length Ly-SiGe of the SiGe substrate 1 along the Y direction (refer to FIG. 6) and the width Wx-Si of the Si layer 3 along the X direction is larger than the width Wx-SiGe of the SiGe substrate 1 along the X direction (refer to FIG. 7). Further, two end portions 3E-X1, 3E-X2 of the Si layer 3 along the X direction are arranged on the respective SiGe oxides 9 and two end portions 3E-Y1, 3E-Y2 of the Si layer 3 along the Y direction are also arranged on the respective SiGe oxides 9. Since the SiGe oxide 9 is an element isolation region, both of the cross sections of the active region 15 along the X and Y directions become a "T-shaped" configuration.

A semiconductor device such as a MOSFET is formed on the active region 15. The MOSFET has a gate insulating film (which is a gate oxide film in this example) 21 formed on the upper surface of the Si layer 3, a gate electrode 23 formed on the gate oxide film 21 and N-type source/drain diffusion layers 25 formed from the Si layer 3 into the SiGe substrate 1.

An inter-level insulating film 27 having openings which reach the source/drain diffusion layers 25 is formed on the MOSFET and SiGe oxides 9. In each opening, a conductive material, which is generally called a plug 29, is formed. Internal wirings 31 which are electrically connected to the source/drain diffusion layers 25 via the plugs 29 are formed on the inter-level insulating film 27.

Thus, the semiconductor device such as the MOSFET can be formed by use of the manufacturing method according to the first embodiment.

In the MOSFET of this example, the following advantages can be attained.

Since a channel which connects the source/drain diffusion layers to each other is formed in the Si layer 1 formed on the SiGe substrate 1, a structure called a strained semiconductor structure can be obtained. As a result, the operation speed becomes higher in comparison with a typical MOSFET.

Since the element isolation region, that is, SiGe oxide 9 is set back into the fin-shaped active region 15, the electric isolation distance between the adjacent MOSFETs can be increased. As a result, a leak current flowing through a path between the adjacent MOSFETs is reduced and it becomes advantageous in miniaturizing the semiconductor integrated circuit device and attaining the low-voltage operation.

Further, if the isolation distance is set equal to that obtained when MOSFETs with the conventional STI structure are used, the width of the semiconductor active region 15 can be increased and the channel width of the MOSFET can be enlarged. By thus enlarging the channel width, the driving current of the MOSFET can be increased.

PN junction portions 33 lie in a portion sandwiched between the SiGe oxides 9 in the fin-shaped active region 15 and the area of each PN junction portion 33 becomes smaller in comparison with that of the typical MOSFET. By thus reducing the area of the PN junction portion 33, parasitic PN junction capacitance between the source/drain diffusion layer 25 and the bulk or SiGe substrate 1 in this example can be reduced. By thus reducing the parasitic PN junction capacitance, the operation is further enhanced in comparison with that of the typical strained semiconductor structure.

Further, in the MOSFET of this example, the PN junction portions 33 lie in a portion sandwiched between the SiGe oxides 9 in the fin-shaped active region 15. The end portions 3E-X1, 3E-X2, 3E-Y1, 3E-Y2 of the Si layer 3 are arranged on the SiGe oxides 9. As the MOSFET structure, a structure in which silicide layers are formed on the surfaces of the source/drain diffusion layers 25 to lower the contact resistances of the source/drain diffusion layers 25 and plugs 29 is provided. In the MOSFET of this example, for example, when the silicide layers are formed on the surfaces of the source/drain diffusion layers 25, the following advantages can be attained. In order to clearly understand the advantages, one example of formation of the silicide layer of this example is explained in comparison with that of a reference example of this example.

FIGS. 9A to 12A show a structure of an example (reference example) in which the end portions (3E-Y1, 3E-Y2 in the drawing) of the Si layer 3 are arranged on the SiGe substrate 1. Further, FIGS. 9B to 12B show a structure of this example in which the end portions (3E-Y1, 3E-Y2 in the drawing) of the Si layer 3 are arranged on the SiGe oxide 9.

FIGS. 9A, 9B show cross sections obtained after the source/drain diffusion layers 25 are formed. An oxide film which is called a sacrifice oxide film 41 is formed on the surface of the Si layer 3 (on the surface of the source/drain diffusion layer 25 in this example) although this is not explained so far. For example, the sacrifice oxide film 41 is formed between the SiN layer 5 (refer to FIG. 1) and the Si layer 3 and functions to reduce damages given to the Si layer 3 when the SiN layer 5 is formed and damages given to the Si layer 3 when the ion-implantation process is performed to form the source/drain diffusion layers 25. When the surface of the source/drain diffusion layers 25 is formed into a silicide form, the sacrifice oxide film 41 must be removed. This is because the Si layer 3 is prevented from being silicided if the sacrifice oxide film 41 is left behind. The cross section obtained after the sacrifice oxide film 41 is removed is shown in FIGS. 10A, 10B.

As shown in FIGS. 10A, 10B, when the sacrifice oxide film 41 is removed, the oxide film is etched. At the time of the above etching process and at the time of etching, such as the wet process, which separates the SiN layer 5 and adjusts the height of the STI region, the etching process proceeds along the end portions (3E-Y1, 3E-Y2 in the drawing) of the Si layer 3. As a result, pits 45 may be formed in Si oxides 43 in the reference example and in the SiGe oxides 9 in this example in some cases. Cross sections obtained after, for example, refractory metals such as tungsten layers 47 are formed in states in which the pits 45 are formed are shown in FIGS. 11A, 11B.

As shown in FIGS. 11A, 11B, the tungsten layers 47 are also formed in the pits 45. If the siliciding process is performed while the tungsten layers 47 are formed in the pits 45, silicide layers 49 are formed in the pits 45 as shown in FIGS. 12A, 12B. As a result, the silicide layer 49 extends towards a portion below the Si layer 3 and comes closer to the PN junction portion 33.

As shown in FIG. 12A, in the reference example, since the end portions 3E-Y1, 3E-Y2 of the Si layer 3 are arranged on the SiGe substrate 1, a distance 51 between the silicide layer 49 and the PN junction portion 33 becomes extremely short. The silicide layer 49 may reach the SiGe substrate 1 via the PN junction portion 33 in some cases. If the silicide layer 49 reaches the SiGe substrate 1, the source/drain diffusion layer 25 is short-circuited to the substrate 1 (the back-gate of the MOSFET), thus increasing a leak current, making it difficult to perform the low-voltage operation. In the worst case, the circuit is made defective, which lowers the manufacturing yield of the semiconductor integrated circuit device.

In the MOSFET of this example, as shown in FIG. 12B, even when the silicide layer 49 is formed in the pits 45, the SiGe oxide 9 is formed between the silicide layer 49 and the PN junction portion 33, and therefore, the distance 51 can be made sufficiently long. As a result, an increase in the leak current can be suppressed in comparison with a case of the reference example. This is advantageous in performing the low-voltage operation. Of course, since short-circuiting between the silicide layer 49 and the SiGe substrate 1 can be suppressed by the SiGe oxide 9, the manufacturing yield can be enhanced in comparison with a case of the reference example.

Thus, the MOSFET of this example has advantages that the leak current can be suppressed, the low-voltage operation can be adequately performed and short-circuiting between the silicide layer 49 and the SiGe substrate 1 can be suppressed to enhance the manufacturing yield when the silicide layer 49 is formed on the surface of the source/drain diffusion layer 25, for example.

Second Embodiment

The second embodiment relates to an example associated with the definition of the width of a trench and relates to a semiconductor device having various widths of trenches.

FIG. 13 is a cross sectional view showing a first example of the width of a trench and FIG. 14 is a cross sectional view showing a second example of the width of a trench.

As shown in FIG. 13, the first example of a trench 7 is an example in which the trench 7 can be filled with an SiGe oxide 9 as explained in the first embodiment. In this case, the width "Wt" of the trench 7 is set to "Wt≦(Tsg×2)" when the thickness of the SiGe oxide 9 which grows from the side walls (the original surfaces are indicated by reference symbols 13) of the trench 7 is set to "Tsg".

On the other hand, as shown in FIG. 14, when the width "Wt" of the trench 7 is set to "Wt>(Tsg×2)", the trench 7 cannot be fully filled with the SiGe oxide 9 and a concave portion 61 is formed.

Figure 15:
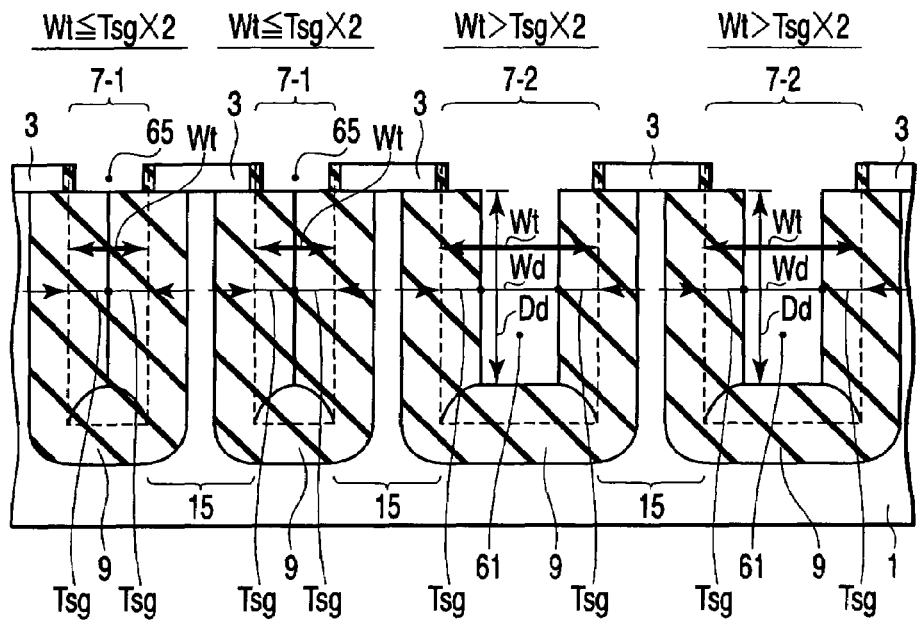
FIG. 15 is a cross sectional view showing one example of a semiconductor device according to a second embodiment of this invention.

In a semiconductor integrated circuit device in which various circuits are integrated with high integration density on one chip, the widths Wt of the trenches 7 are set to various values. For example, the widths Wt of the trenches 7 are set to various values depending on the degree of the density (integration density) with which semiconductor elements such as transistors are integrated, the size of the transistor and the like. Therefore, in the actual semiconductor integrated circuit device, it becomes difficult in some cases to set the width Wt of each trench 7 to a value as indicated in FIG. 13. In such a case, as shown in FIG. 15, it is possible to form trenches 7-1 in which the width Wt is set to "Wt≦(Tsg×2)" and trenches 7-2 in which the width Wt is set to "Wt>(Tsg×2)" in the substrate 1 as shown in FIG. 15.

Figure 16:
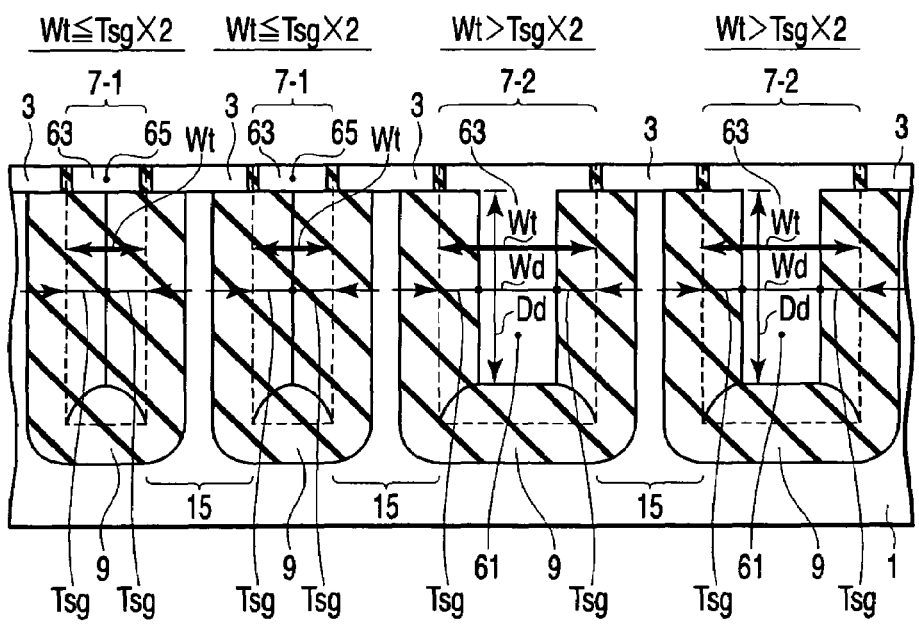
FIG. 16 is a cross sectional view showing another example of the semiconductor device according to the second embodiment of this invention.

The concave portion 61 is formed in each of the trenches 7-2 and, for example, the concave portion 61 may be filled with an insulator 63, for example, silicon dioxide as shown in FIG. 16. At this time, for example, if the aspect ratio "Dd/Wd" of the concave portion 61 is set to a value with which the concave portion can be filled with the insulator 63, the concave portion 61 can be fully filled. In this case, "Dd" indicates the depth of the concave portion 61 and "Wd" indicates the width of the concave portion 61. At this time, concave portions 65 are respectively formed between the Si layers 3 and the concave portions 65 may be filled with the insulators 63 when the concave portions 61 are filled with the insulators 63.

According to the semiconductor device of the second embodiment, the trenches 7 can be filled with insulators such as SiGe oxides 9 even when the aspect ratio is increased and the opening diameter is reduced as the trenches 7-1 become more difficult to be filled, by use of a typical method in the semiconductor device having the trenches 7-1 of small width and the trenches 7-2 of large width.

Reference symbols "Tsb", "Tbg", "Tbb" shown in FIGS. 13 and 14 respectively indicate the thickness of the SiGe oxide 9 which is set back from the side wall of the trench 7, the thickness of the SiGe oxide 9 which grows from the bottom surface of the trench 7 and the thickness of the SiGe oxide 9 which is set back from the bottom surface of the trench 7. Further, reference symbols "Tox9", "Tox11" respectively indicate the thickness of the SiGe oxide 9 formed on the side wall of the trench 7 and the thickness of the Si oxide 11 formed on the side wall of the Si layer 3.

Third Embodiment

The third embodiment relates to a semiconductor device obtained by further improving the characteristic of the semiconductor device having the strained semiconductor structure.

Figure 17:
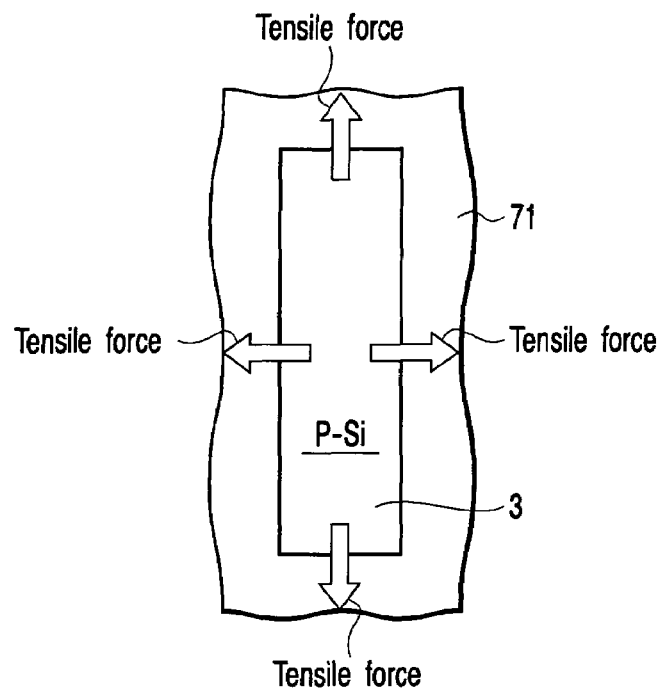
FIG. 17 is a plan view showing one example of a semiconductor device having a strained semiconductor structure.
Figure 18:
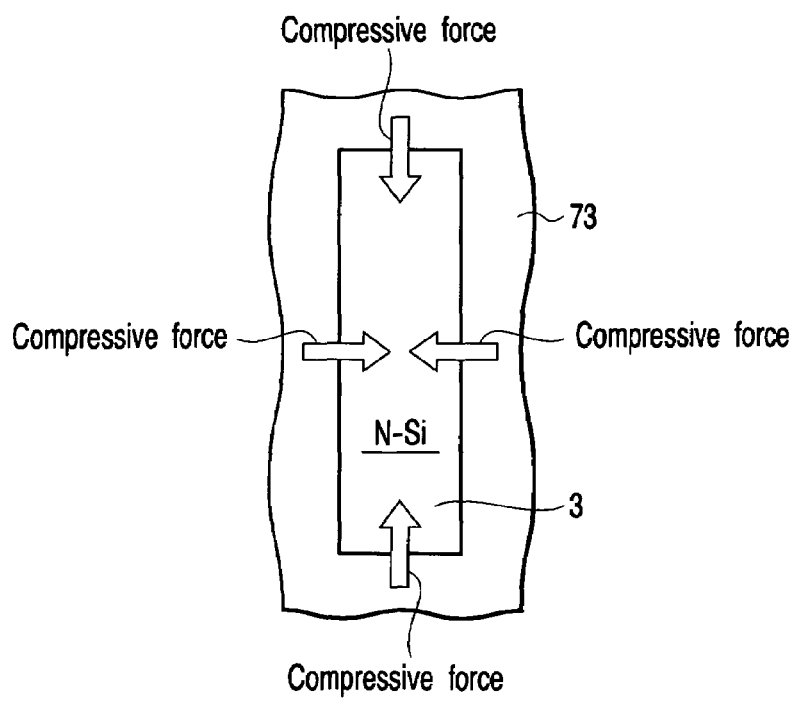
FIG. 18 is a plan view showing another example of the semiconductor device having the strained semiconductor structure.

The operation speed of the semiconductor device having the strained semiconductor structure is further enhanced if tensile force is caused in a P-type Si layer 3 in a strained semiconductor N-channel MISFET and compressive force is caused in an N-type Si layer 3 in a strained semiconductor P-channel MISFET. Basically, in the case of the P-type Si layer 3, a tensile material 71 which applies tensile force to the P-type Si layer 3 is formed around the P-type Si layer 3 as shown in FIG. 17. In the case of the N-type Si layer 3, a compression material 73 which applies compressive force to the N-type Si layer 3 is formed around the N-type Si layer 3 as shown in FIG. 18.

Figure 19:
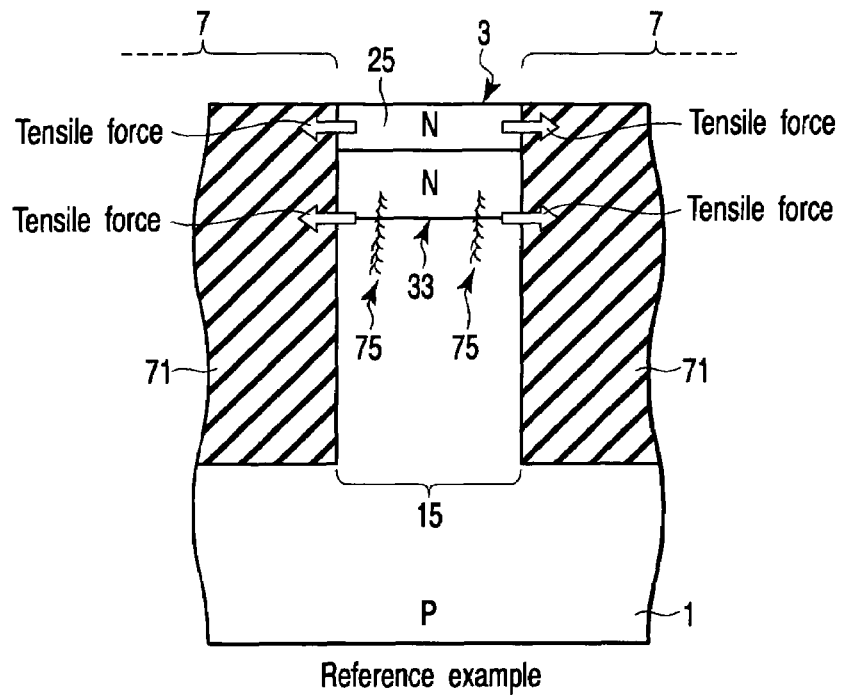
FIG. 19 is a cross sectional view showing a semiconductor device according to a reference example.

A case wherein, for example, the structure shown in FIG. 17 is applied to the MISFET having the typical STI structure is shown in FIG. 19. The MISFET shown in FIG. 19 is a reference example.

As shown in FIG. 19, when the tensile materials 71 are formed on the side walls of a trench 7 in the MISFET according to the reference example, the tensile materials 71 are set closer to a PN junction portion 33. Therefore, faults 75 which penetrate through the PN junction portion 33 tend to occur. If the faults 75 which penetrate through the PN junction portion 33 occur, a leak current from a source/drain diffusion layer 25 to a bulk (SiGe substrate 1) increases. As a result, it becomes difficult to perform the low-voltage operation of the MISFET and, in the worst case, the circuit will become defective. This lowers the manufacturing yield.

Figure 20:
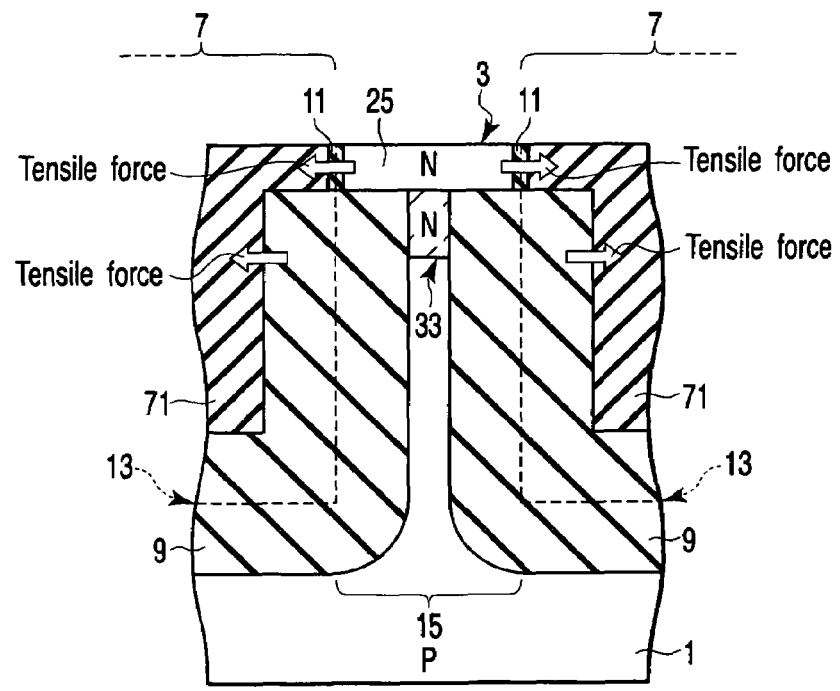
FIG. 20 is a cross sectional view showing one example of a semiconductor device according to a third embodiment of this invention.

On the other hand, in the semiconductor device, for example, MISFET according to the third embodiment, as shown in FIG. 20, since thick SiGe oxides 9 are formed between the tensile materials 71 and the PN junction portion 33, the faults 75 which penetrate through the PN junction portion 33 become difficult to occur in comparison with a case of the MISFET shown in FIG. 19. Therefore, an increase in the leak current from the source/drain diffusion layer 25 to the bulk (SiGe substrate 1) can be suppressed and it is advantageous in attaining the low-voltage operation of the MISFET. Further, since occurrence of the faults 75 is suppressed, a lowering in the manufacturing yield can be suppressed.

FIGS. 19, 20 show a case wherein the Si layer 3 is of a P type, the source/drain diffusion layer is of an N type and the tensile material 71 which applies tensile force to the Si layer 3 is used. However, this invention can also be applied to a case wherein the Si layer 3 is of the N type, the source/drain diffusion layer is of the P type and the compression material 73 which applies compressive force to the Si layer 3 is used.

Next, a manufacturing method of the semiconductor device according to the third embodiment is explained.

Figure 21:
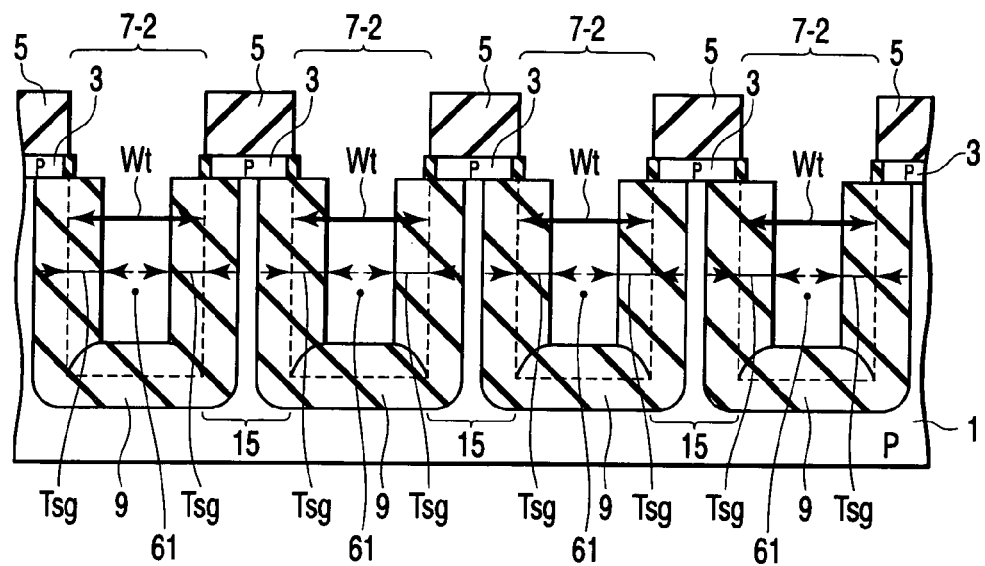
FIG. 21 is a cross sectional view showing one example of a step of a manufacturing method of the semiconductor device according to the third embodiment of this invention.
Figure 22:
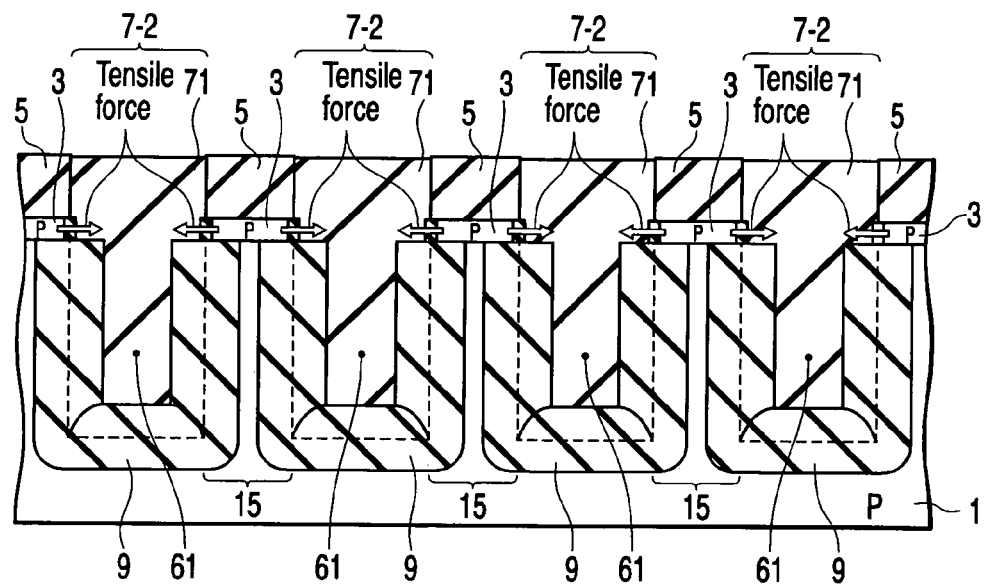
FIG. 22 is a cross sectional view showing one example of a step of the manufacturing method of the semiconductor device according to the third embodiment of this invention.

FIGS. 21 and 22 are cross sectional views showing one example of a manufacturing method of the semiconductor device according to the third embodiment of this invention.

As shown in FIG. 21, a structure in which the width "Wt" of the trench 7 is set to "Wt>(Tsg×2)" as explained with reference to FIG. 14 is formed. Since the trenches 7 cannot be fully filled with the SiGe oxides 9, concave portions 61 are formed between fin-shaped active regions 15.

Next, as shown in FIG. 22, a tensile material 71 is deposited on the structure of FIG. 21 and then the surface of the tensile material 71 is polished and made flat by use of a CMP method, for example, so as to fill the tensile materials 71 into the respective concave portions 61.

The semiconductor device according to the third embodiment can be manufactured by use of the steps shown in FIGS. 21 and 22.

Next, a modification of the third embodiment is explained.

(First Modification)

Figure 23:
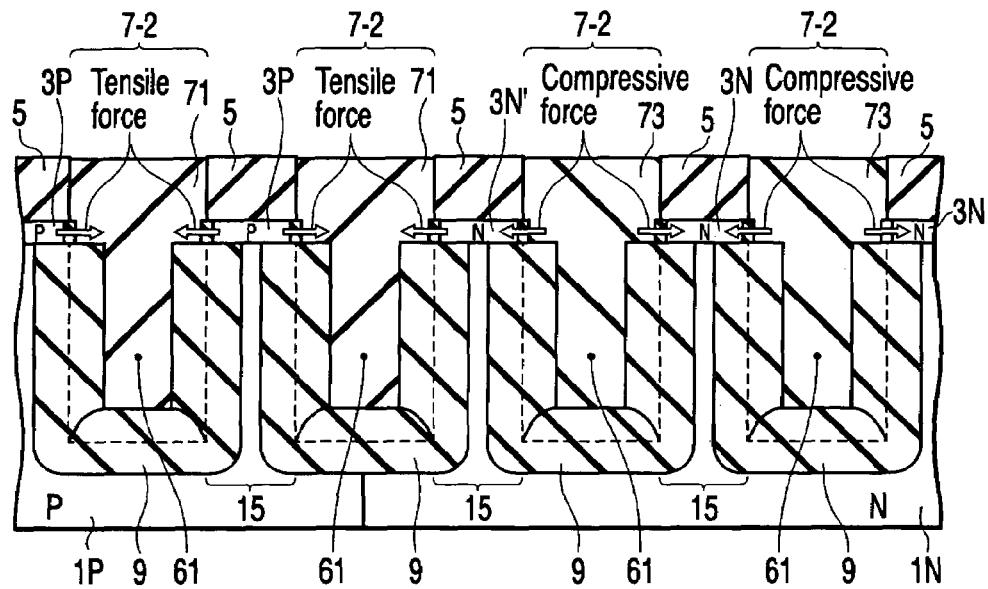
FIG. 23 is a cross sectional view showing a first modification of the semiconductor device according to the third embodiment of this invention.

FIG. 23 is a cross sectional view showing the first modification of the semiconductor device according to the third embodiment of this invention.

As shown in FIG. 23, a semiconductor integrated circuit is generally of a CMOS type. That is, N-channel MISFETs and P-channel MISFETs are provided together in one semiconductor integrated circuit. Therefore, tensile materials 71 may be formed around P-type Si layers 3P in which the N-channel MISFETs are formed and compression materials 73 may be formed around N-type Si layers 3N in which the P-channel MISFETs are formed.

Further, as shown in FIG. 23, both of the tensile material 71 and compression material 73 are formed around an N-type Si layer 3N' which is part of the N-type Si layers 3N (or P-type Si layers 3P). That is, the N-type Si layer 3N' is applied with the tensile force and compressive force at the same time. Therefore, it is predicted that the characteristic of the P-channel MISFET formed on the N-type Si layer 3N' and the characteristic of the P-channel MISFET formed on the N-type Si layer 3N will be different. If a difference in the characteristic may cause a problem in the integrated circuit, it is possible not to connect the P-channel MISFET formed on the N-type Si layer 3N' to the integrated circuit.

(Second Modification)

Figure 24:
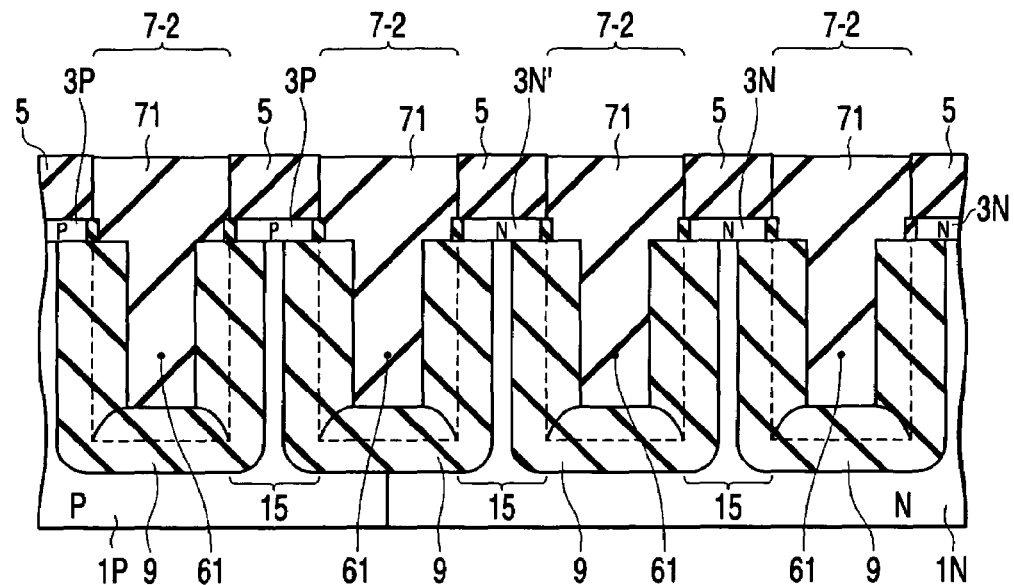
FIG. 24 is a cross sectional view showing a second modification of the semiconductor device according to the third embodiment of this invention.

FIG. 24 is a cross sectional view showing a second modification of the semiconductor device according to the third embodiment of this invention.

As shown in FIG. 24, only the tensile materials 71 or compression materials 73 can be used if it is difficult to separately use the tensile materials 71 and compression materials 73 for the respective P-type Si layers 3P and N-type Si layers 3N.

The semiconductor device of the second modification can be formed by use of the manufacturing method shown in FIGS. 21 and 22.

Figure 25:
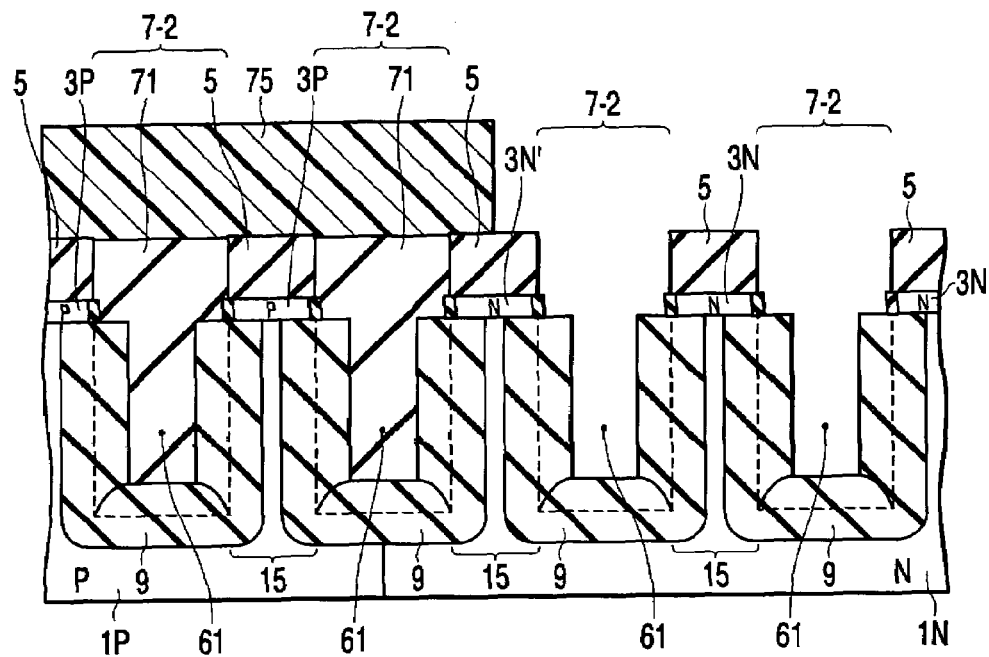
FIG. 25 is a cross sectional view showing one example of a step of the manufacturing method of the semiconductor device according to the third embodiment of this invention.

In the first modification, as shown in FIG. 25, for example, the P-type Si layers 3P are covered with a mask 75 and the N-type Si layers 3N are kept exposed after the concave portions 61 are filled with the tensile materials 71. Then, the tensile materials 71 are removed with the mask 75 used as a mask to expose the concave portions 61 again. After this, the exposed concave portions 61 are filled with compression materials 73.

(Third Modification)

Figure 26:
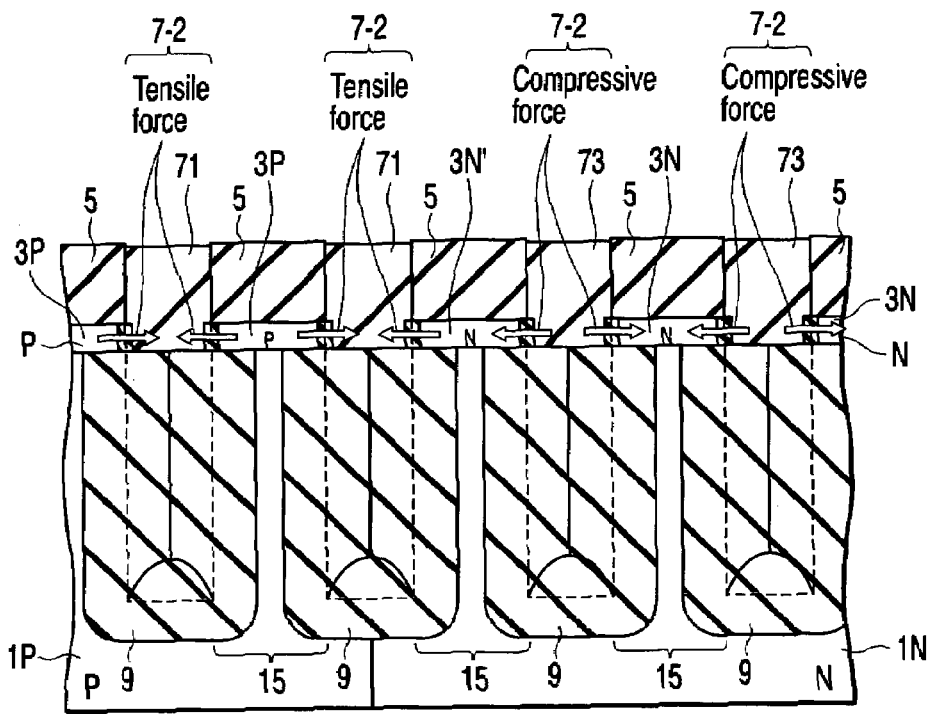
FIG. 26 is a cross sectional view showing a third modification of the semiconductor device according to the third embodiment of this invention.

FIG. 26 is a cross sectional view showing a third modification of the semiconductor device according to the third embodiment of this invention.

In the first and second modifications, the device in which the width "Wt" of the trench 7 is "Wt>(Tsg×2)" is shown. However, the third modification can be applied to a device in which the width "Wt" of the trench 7 is "Wt<(Tsg×2)" as shown in FIG. 26.

Fourth Embodiment

The fourth modification relates to the definition of the width of the active region 15.

Figure 27:
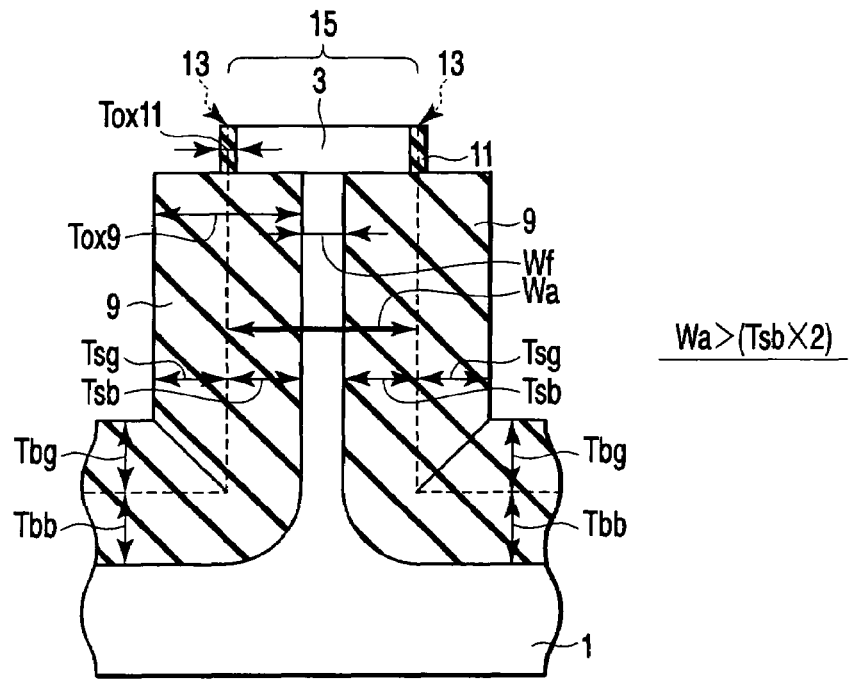
FIG. 27 is a cross sectional view showing a first example of the width of an active region.

As shown in FIG. 27, if the relation between the thickness "Tsb" of the SiGe oxides 9 which are set back from the side walls of the trench 7 and the width "Wa" of the active region 15 is set to "Wa>(Tsb×2)", an SiGe layer with the width "Wf" can be left behind on the active region 15 on which the SiGe oxide 9 has been formed. The thus obtained structure is the structure explained with reference to the first to third embodiment.

Figure 28:
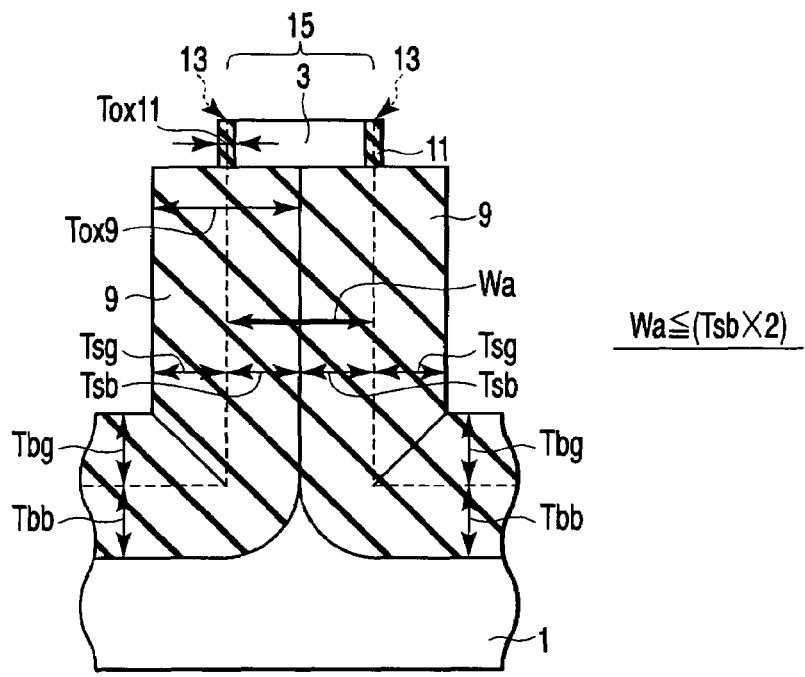
FIG. 28 is a cross sectional view showing a second example of the width of the active region.

FIG. 28 is a cross sectional view showing an example of a semiconductor device according to a fourth embodiment of this invention.

However, as shown in FIG. 28, if the relation between the thickness "Tsb" of the SiGe oxide 9 and the width "Wa" of the active region 15 is set to "Wa≦(Tsb×2)", a structure in which part of the active region 15 which corresponds to the SiGe substrate 1 is oxidized and the Si layer 3 is formed on the SiGe oxide 9 can be obtained. The structure is equivalent to the SOI (Silicon (or Semiconductor) On Insulator) structure.

That is, the manufacturing method explained in the above embodiment can be performed to simply form the SOI structure by setting the relation between the thickness "Tsb" of the SiGe oxide 9 and the width "Wa" of the active region 15 to "Wa≦(Tsb×2)". Further, since the Si layer 3 is formed on the SiGe substrate 1, an SOI structure having an advantage obtained by the strained semiconductor structure, for example, an advantage that the mobility of carriers can be enhanced, that is, a so-called strained SOI structure can be attained. It is known that the typical strained SOI structure can be formed by use of a method which utilizes the SIMOX (Separation by Implantation Oxygen) technique with respect to the SiGe substrate, a method which laminates the SiGe substrate on an insulating substrate or a method which utilizes the oxidation concentration method with respect to the SOI substrate. However, the process of each of the above methods is complicated.

On the other hand, in this example, the relation between the thickness "Tsb" of the SiGe oxide 9 and the width "Wa" of the active region 15 is set to "Wa≦(Tsb×2)" and then trenches 7 are formed. After this, the strained SOI structure can be obtained simply by oxidation and the process is simple. Further, the thickness of the Si layer 3 can be controlled to be thin. For example, if the thickness of the Si layer 3 is set to ¼ or less of the thickness of the gate length of the MISFET, the structure which is highly resistant to the short channel effect can be attained.

First Example

FIG. 29 is a cross sectional view showing a first example of the semiconductor device according to the fourth embodiment.

As shown in FIG. 29, in the first example, the relation between the width "Wa" of the active region 15 and the thickness "Tsb" of the SiGe oxide 9 is set to "Wa≦(Tsb×2)" and the relation between the width "Wt" of the trench 7-1 and the thickness "Tsg" of the SiGe oxide 9 is set to "Wt≦(Tsg×2)".

Thus, in the first example, the trenches 7-1 are filled with the SiGe oxides 9 and the Si layers 3 are formed on the SiGe oxides 9 to configure the strained SOI structure.

Second Example

FIG. 30 is a cross sectional view showing a second example of the semiconductor device according to the fourth embodiment.

As shown in FIG. 30, in the second example, the relation between the width "Wa" of the active region 15 and the thickness "Tsb" of the SiGe oxide 9 is set to "Wa≦(Tsb×2)" and the widths of the trenches 7 are set to two or more values. In this example, the relation between the width "Wt" of the trench 7-1 and the thickness "Tsg" of the SiGe oxide 9 is set to "Wt≦(Tsg×2)" and the relation between the width "Wt" of the trench 7-1 and the thickness "Tsg" of the SiGe oxide 9 is set to "Wt>(Tsg×2)".

Thus, in the second example, the Si layers 3 are formed on the SiGe oxides 9 in a structure having a portion in which the trenches 7-1 are filled with the SiGe oxides 9 and a portion in which the concave portions 61 are formed to configure the strained SOI structure. The semiconductor device can be formed with the above structure.

Third Example

Figure 31:
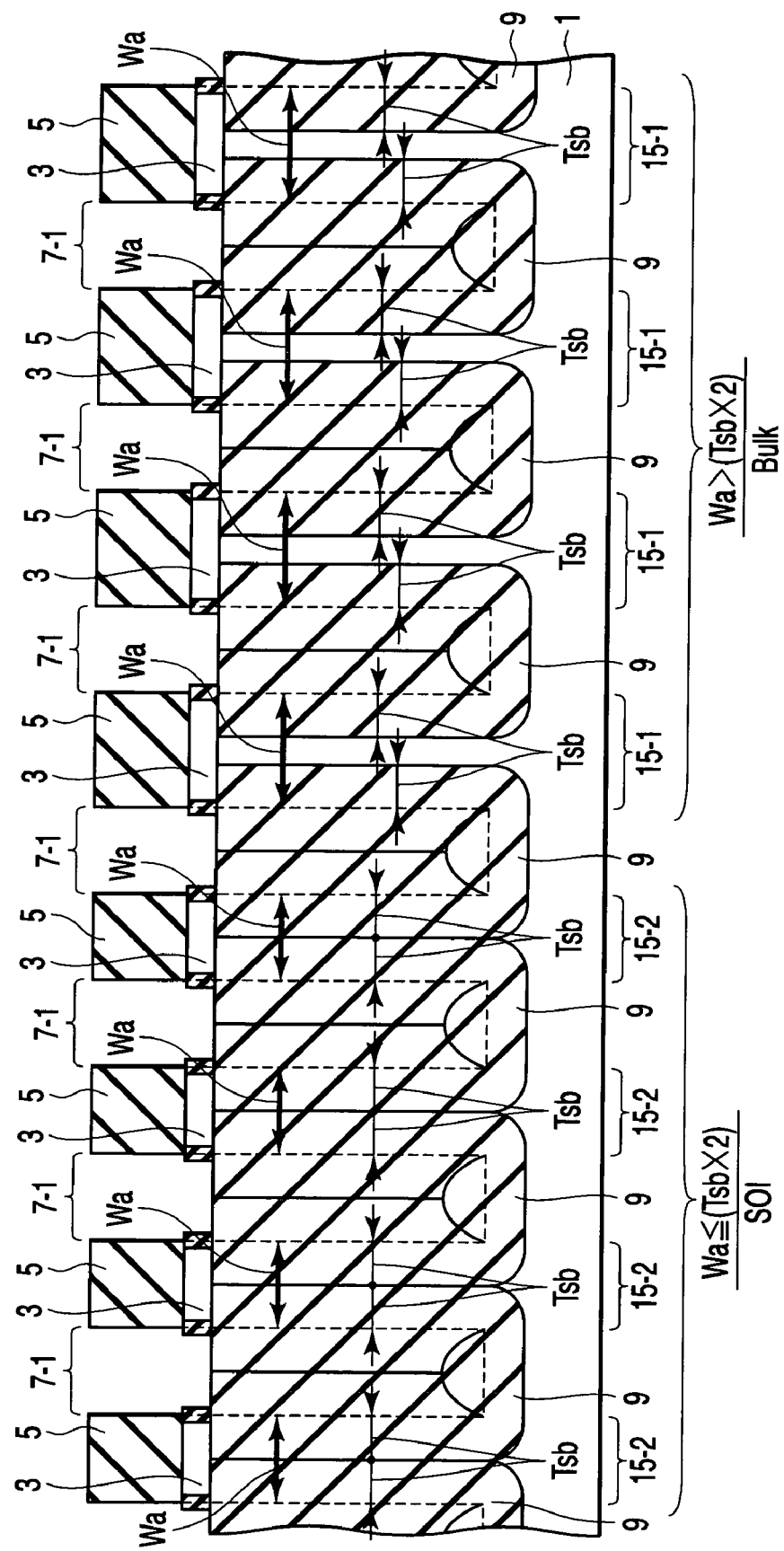
FIG. 31 is a cross sectional view showing a third example of the semiconductor device according to the fourth embodiment of this invention.

FIG. 31 is a cross sectional view showing a third example of the semiconductor device according to the fourth embodiment.

As shown in FIG. 31, in the third example, a portion (SOI) of the SOI structure and a portion (bulk) of the bulk structure are formed on one SiGe substrate 1. More specifically, a portion (active region 15-2) in which the relation between the width "Wa" of the active region 15 and the thickness "Tsb" of the SiGe oxide 9 is set to "Wa≦(Tsb×2)" is formed to have the SOI structure and a portion (active region 15-1) in which the relation is set to "Wa>(Tsb×2)" is formed to have the bulk structure.

In the third example, the portion of the SOI structure and the portion of the bulk structure can be easily formed on one SiGe substrate 1 simply by changing the width "Wa" of the active region 15 by use of the manufacturing method of the semiconductor device according to this embodiment.

Next, an application example of the semiconductor device of the third example is explained.

Figure 32:
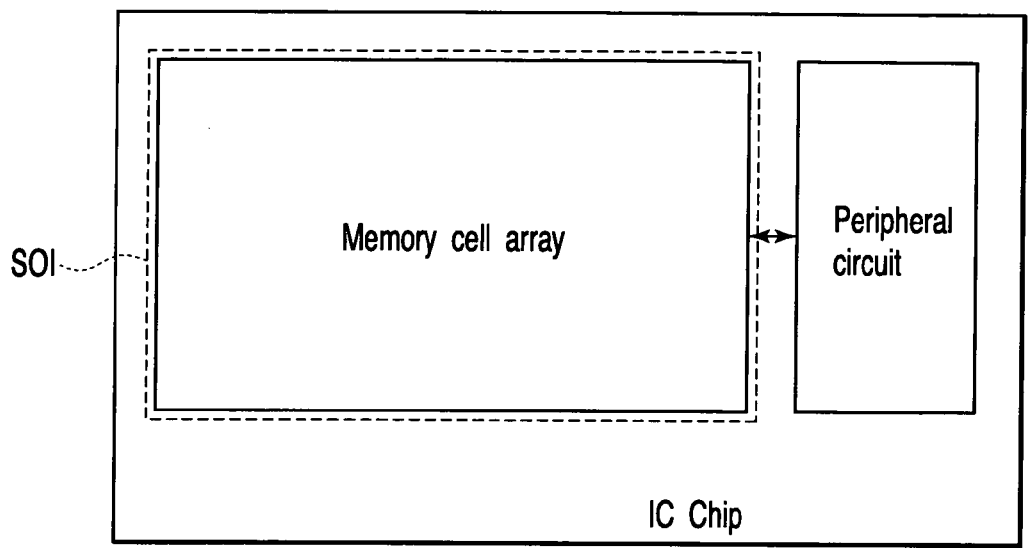
FIG. 32 is a plan view showing a first application example of the semiconductor device according to the third example.

FIG. 32 is a plan view showing a first application example of the semiconductor device according to the third example.

One of the advantages of the SOI structure is that the resistance to soft error is high. The soft error is a phenomena that occurs in a semiconductor memory device, in which data stored in the storage node is inverted by, for example, electrons and holes caused by high energy particles such as α rays or neutrons passing through the semiconductor substrate. Particularly, soft errors in a DRAM cell or SRAM cell are well known. The semiconductor region in the SOI structure is smaller in comparison with that in the bulk structure since the Si layers 3 are provided only on the SiGe oxides 9. Therefore, in the SOI structure shown in the present embodiment, since the SiGe oxides 9 are provided and the Si layers 3 which are extremely thin are provided on the respective SiGe oxides 9, the locus along which the high energy particles pass through the semiconductor layer becomes shorter and, as a result, the amount of generated electron-hole pairs becomes less. For example, the thickness of the Si layer 3 is set equal to or less than the critical film thickness of a strained Si layer, which is determined by the Ge concentration of the SiGe layer. One concrete example of the numeric value is 20 nm or less. Thus, the soft error resistance is higher in the SOI structure than in the bulk structure.

Therefore, as shown in FIG. 32, a memory cell array is formed on the portion (SOI) of the SOI structure. For example, a region other than the memory cell array is formed with the bulk structure.

In the semiconductor device of FIG. 32, since the memory cell array is formed on the portion of the SOI structure, the soft error resistance of the memory cell array can be enhanced.

Figure 33:
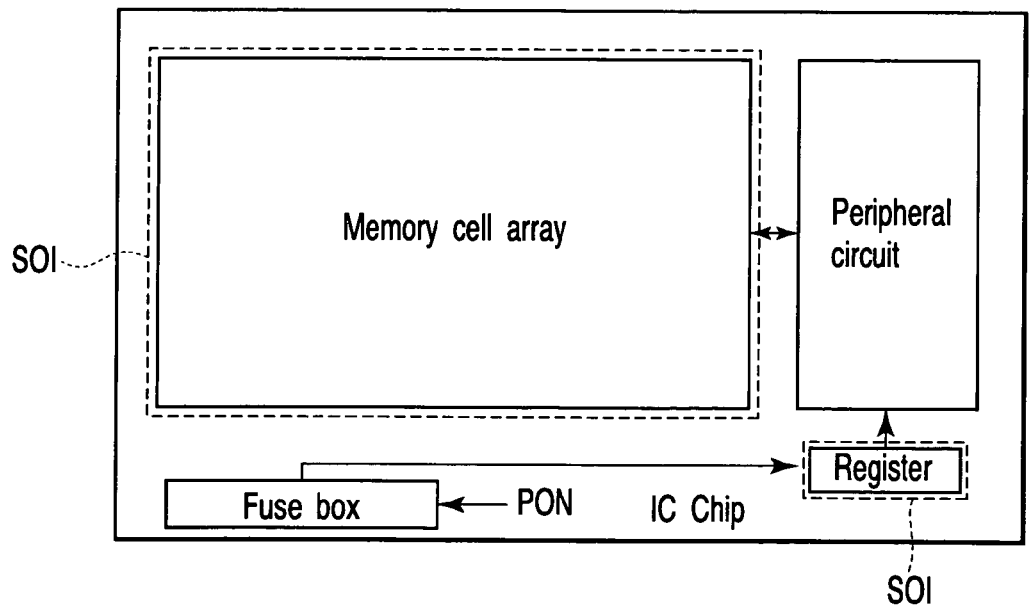
FIG. 33 is a plan view showing a second application example of the semiconductor device according to the third example.

FIG. 33 is a plan view showing a second application example of the semiconductor device according to the third example.

Like the first application example, the second application example is a semiconductor integrated circuit device having a memory cell array. In the second application example, the memory cell array is formed on the portion of the SOI structure (SOI). Further, the second application example has a fuse box and register. The fuse box is a region in which device information is programmed and the register is a circuit which stores device information read out from the fuse box. One example of the device information is redundancy information of the memory cell array. The redundancy information is read out from the fuse box according to a power-ON detection signal PON at the turn-ON time of the power supply and stored into the register provided adjacent to a peripheral circuit. The fuse box utilizes fuses as elements which store information, for example. The register utilizes a latch circuit as an element which stores information, for example. The latch circuit is substantially equal to an SRAM cell and is conventionally understood as a memory which has high soft error resistance. However, as the latch circuit is further miniaturized, the capacity of the latch node which latches information becomes smaller and, for example, occurrence of a soft error becomes a problem as in a DRAM cell.

Therefore, as shown in FIG. 33, the register is formed on the portion of the SOI structure (SOI). As a result, the soft error resistance of the register can be made higher. A region other than the register and memory cell array is formed with the bulk structure, for example.

The soft error can be easily restored by simply rewriting data since it does not cause the memory cell to be broken in a hardware fashion. The soft error occurred in the memory cell array may be coped with by correcting data. However, unlike the memory cell array, the process for rewriting data is not taken into consideration when designing the register which stores device information. Therefore, if a soft error occurs in the register, data cannot be restored unless the power supply is turned ON again. In addition, since device information is stored in the register, the operation of the integrated circuit itself is disturbed and becomes unstable if a soft error occurs in the device information. That is, in the register which stores the device information, enhancement of the soft error resistance is advantageous in stabilizing the operation of the integrated circuit.

Further, as shown in FIG. 33, the region of the register is smaller in comparison with the peripheral circuit and memory cell array. With the manufacturing method explained in the above embodiment, the SOI structure and the bulk structure can be selectively and separately formed simply by changing the width "Wa" of the active region 15 and, for example, a small region in which the register is formed is locally formed with the SOI structure.

Fourth Example

The fourth example is an example obtained by combining the third and fourth embodiments and tensile materials 71 which apply tensile force to Si layers 3 or compression materials 73 which apply compressive force to the Si layers 3 are formed around the Si layers 3 with the SOI structure.

Figure 34:
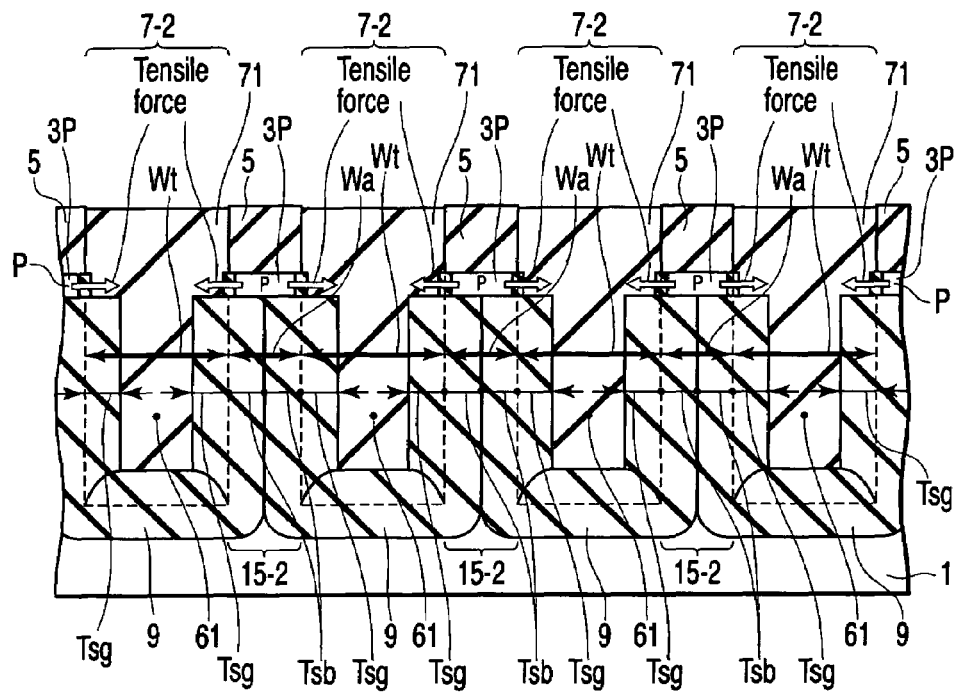
FIG. 34 is a cross sectional view showing a fourth example of the semiconductor device according to the fourth embodiment of this invention.

FIG. 34 is a cross sectional view showing the fourth example of the semiconductor device according to the fourth embodiment.

As shown in FIG. 34, in the fourth example, concave portions 61 are provided and, in this example, the tensile materials 71 are formed to extend from the internal portions of the concave portions 61 to the peripheral portions of the Si layers 3, in this example, P-type Si layers 3P. Active regions 15-2 are oxidized by use of the SiGe oxides 9 to configure strained SOI structures.

In order to obtain the structure of the fourth example, the relation between the width "Wa" of the active region 15-2 and the thickness "Tsb" of the SiGe oxide 9 may be set to "Wa≦(Tsb×2)" and the relation between the width "Wt" of the trench 7-2 and the thickness "Tsg" of the SiGe oxide 9 may be set to "Wt>(Tsg×2)".

Thus, the fourth embodiment can be combined with the third embodiment.

Fifth Example

Like the fourth example, the fifth example is an example obtained by combining the third and fourth embodiments.

Figure 35:
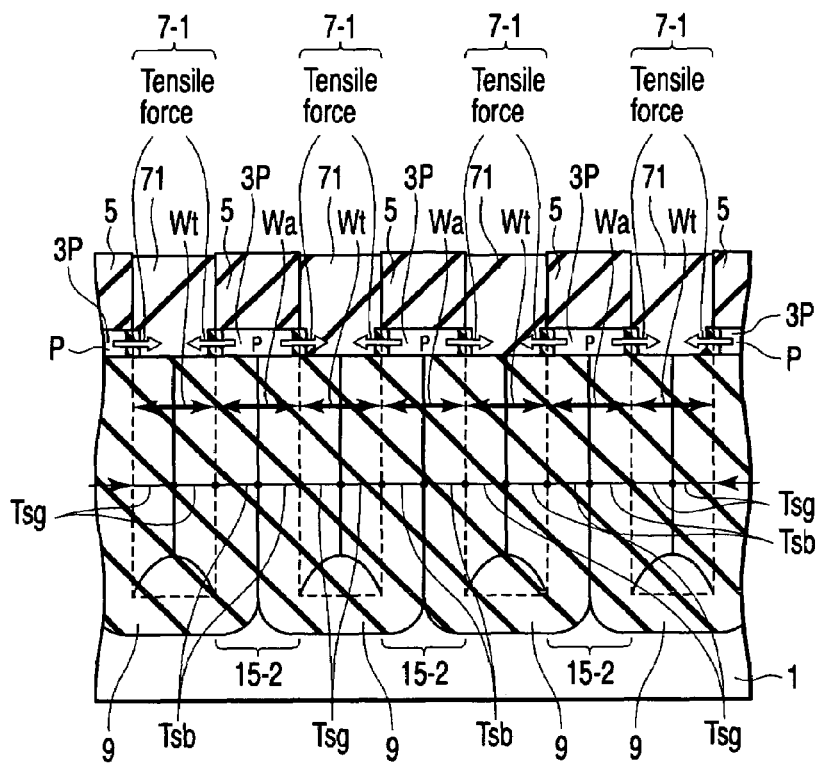
FIG. 35 is a cross sectional view showing a fifth example of the semiconductor device according to the fourth embodiment of this invention.

FIG. 35 is a cross sectional view showing the fifth example of the semiconductor device according to the fourth embodiment.

As shown in FIG. 35, the fifth example is an example in which the trenches 7-1 are filled with the SiGe oxides 9. The active regions 15-2 are formed as the SiGe oxides 9 to configure SOI structures. The Si layers 3 which are the P-type Si layers 3P in this example are formed on the respective SiGe oxides 9. The tensile materials 71 are formed on portions of the SiGe oxides 9 which respectively lie between the adjacent Si layers 3P.

In order to obtain the structure of the fifth example, the relation between the width "Wa" of the active region 15-2 and the thickness "Tsb" of the SiGe oxide 9 may be set to "Wa≦(Tsb×2)" and the relation between the width "Wt" of the trench 7-1 and the thickness "Tsg" of the SiGe oxide 9 may be set to "Wt≦(Tsg×2)".

Sixth Example

Like the fourth and fifth examples, the sixth example is an example obtained by combining the third and fourth embodiments.

Figure 36:
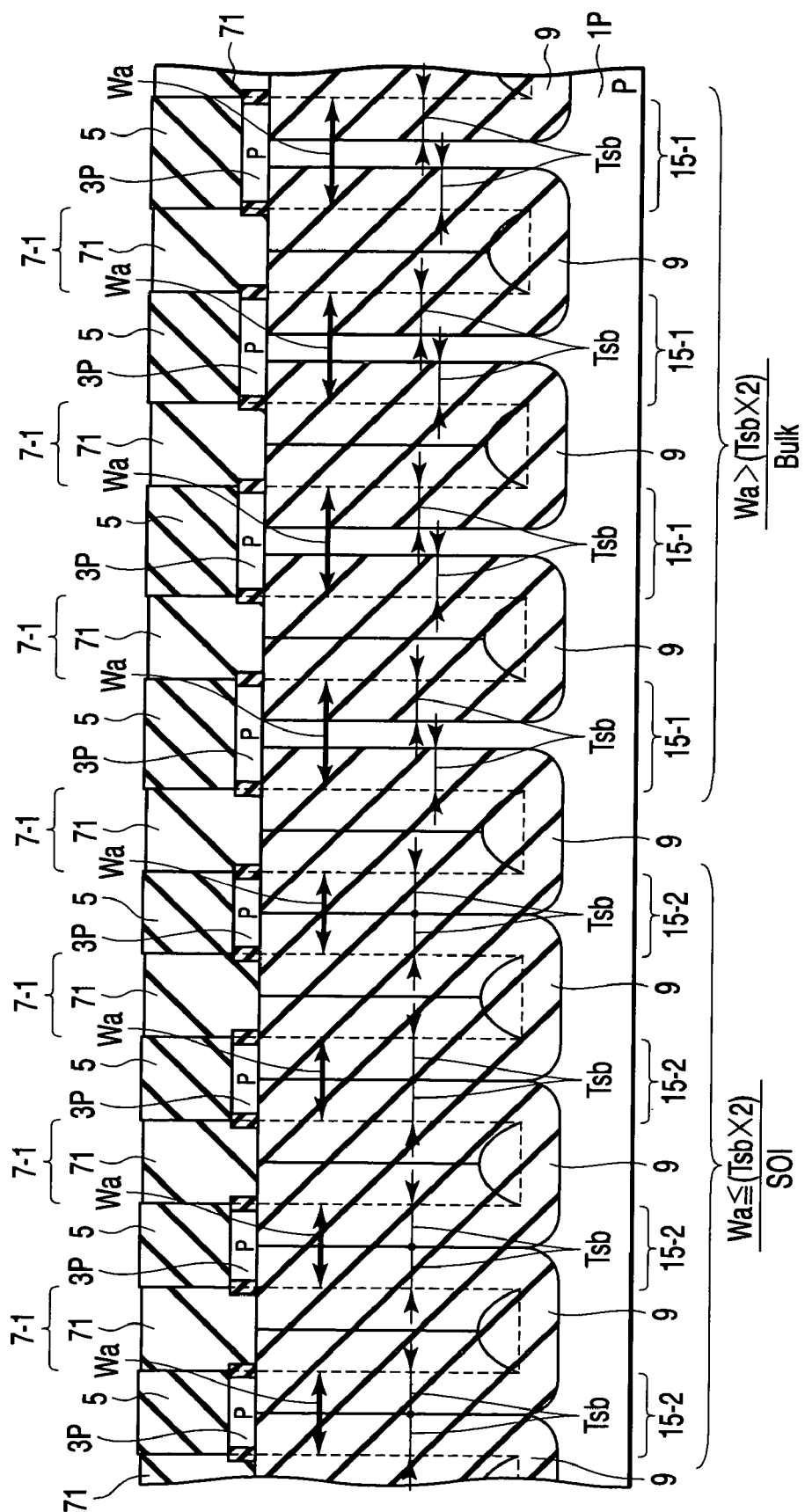
FIG. 36 is a cross sectional view showing a sixth example of the semiconductor device according to the fourth embodiment of this invention.

FIG. 36 is a cross sectional view showing the sixth example of the semiconductor device according to the fourth embodiment.

As shown in FIG. 36, the sixth example is an example in which a portion (SOI) of the SOI structure and a portion (bulk) of the bulk structure are provided on one SiGe substrate 1. The active regions 15-2 are formed as the SiGe oxides 9 to configure SOI structures. Portions of the active regions 15-1 which extend from the side surfaces of the active regions 15-1 are formed as the SiGe oxides 9 to configure bulk structures. In this example, the trenches 7-1 are filled with the SiGe oxides 9. The Si layers 3 which are the P-type Si layers 3P in this example are formed on the respective SiGe oxides 9. The tensile materials 71 are formed on portions of the SiGe oxides 9 which respectively lie between the adjacent Si layers 3P.

In order to obtain the structure of the sixth example, portions (active regions 15-2) in which the relation between the width "Wa" of the active region and the thickness "Tsb" of the SiGe oxide 9 is set to "Wa≦(Tsb×2)" and portions (active regions 15-1) in which the relation is set to "Wa>(Tsb×2)" are provided. Further, the relation between the width "Wt" of the trench 7-1 and the thickness "Tsg" of the SiGe oxide 9 may be set to "Wt≦(Tsg×2)".

The fourth, fifth and sixth examples are shown as examples of combinations of the third and fourth embodiments. However, the combinations of the third and fourth embodiments are not limited to the fourth, fifth and sixth examples and any combination other than the above combinations can be used.

Fifth Embodiment

Figure 37:
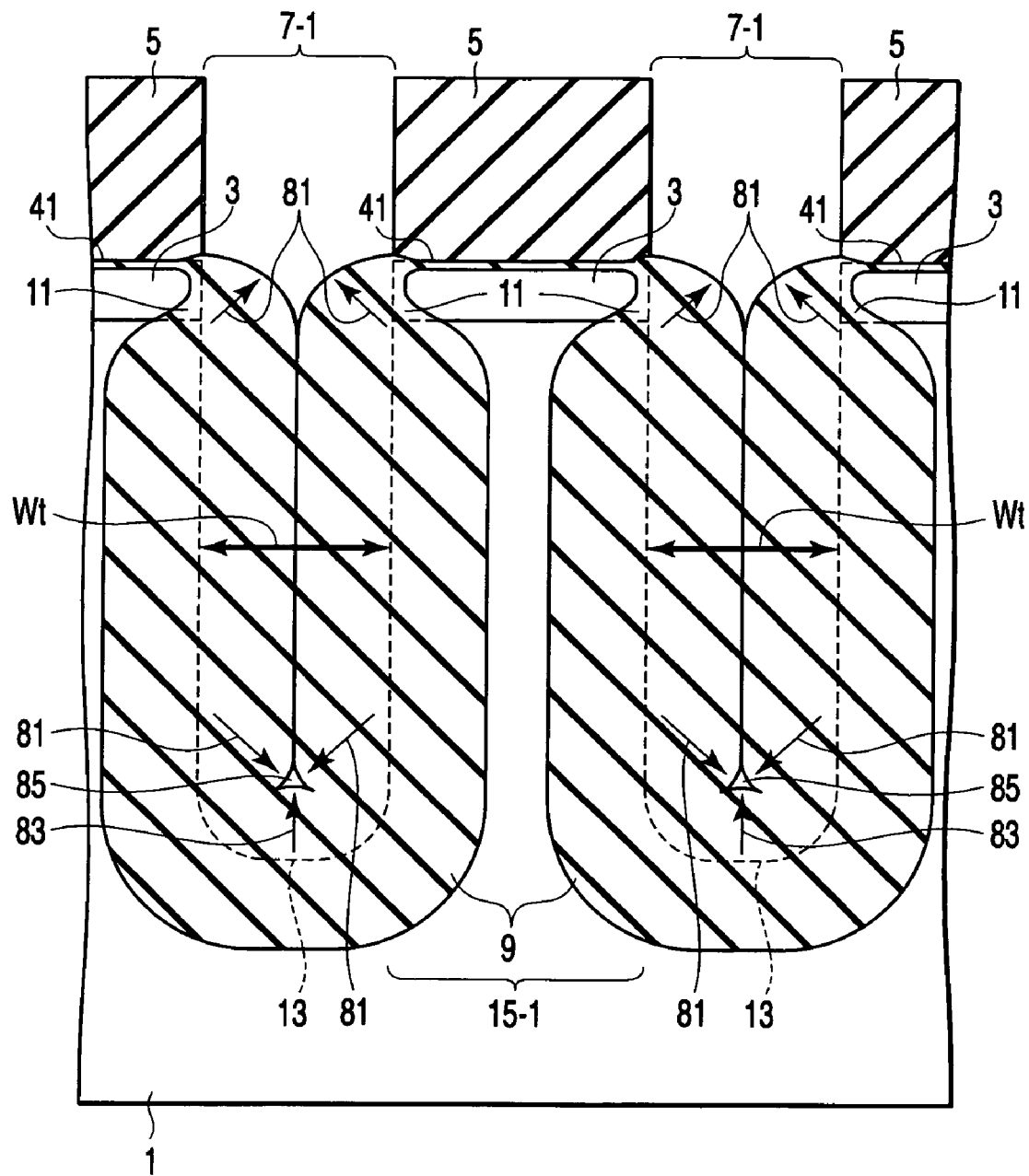
FIG. 37 is a cross sectional view showing one example of a semiconductor device according to a fifth embodiment of this invention.

FIG. 37 is a cross sectional view showing one example of a semiconductor device according to a fifth embodiment of this invention.

As shown in FIG. 37, if an SiGe substrate 1 is oxidized by use of the hydrochloric acid oxidation method explained with reference to the first embodiment, SiGe oxides 9 grow to penetrate into the internal portions of active regions 15-1 (SiGe substrate 1). For example, the oxidation speed of the Si layer 3 is low in a portion of the active region 15-1 which lies near the Si layer 3, and therefore, the oxidation speed of the active region 15-1 is also lowered. As a result, the plane area of the active region 15-1 is large in a portion which is formed in contact with the Si layer 3 and becomes smaller as the portion is separated farther apart from the Si layer 3. The shape of the active region 15-1 is a bottleneck shape. The advantage of the structure is that the contact area between the SiGe layer and the Si layer can be made large. In the structure of the above embodiment, the contact area between the SiGe layer and the Si layer becomes small since the active region 15-1 is oxidized. Therefore, the advantage that there occurs a strong possibility that the degree of strain caused by the process such as heat treatment is reduced and, for example, the carrier mobility is enhanced may be degraded to some extent. In this respect, if the active region 15-1 is formed in the bottleneck shape and the large contact area between the SiGe layer and the Si layer is acquired, the above problem can be solved.

Further, the SiGe oxides 9 grow to expand towards the outside of the active regions 15-1 (SiGe substrate 1). For example, the SiGe oxide 9 grows in directions indicated by arrows 81, 83 from the side surfaces of the trench 7-1 and the bottom surface of the trench 7-1. At this time, in the bottom portion of the trench 7-1, the SiGe oxide 9 which grows from the side surfaces of the trench 7-1 and the SiGe oxide 9 which grows from the bottom surface of the trench 7-1 collide with each other to form voids 85. That is, an STI structure having the void 85 is formed. The advantage of the STI structure having the void 85 is that the dielectric constant of the STI structure is lowered and the capacitance of the STI structure becomes small. The STI structure with the small capacitance is advantageous in enhancing the operation speed of the semiconductor integrated circuit.

Thus, according to the fifth embodiment, the contact area between the SiGe layer and the Si layer can be made large by forming the active region 15-1 in the bottleneck shape and the effect that the advantage of the "strained semiconductor" can be maintained with high reliability can be attained.

Further, in the STI structure having the void, since the STI capacitance becomes small, the effect that it is advantageous to enhance the operation speed of the semiconductor integrated circuit can be attained.

Sixth Embodiment

The sixth embodiment is an example obtained by applying the strained SOI structure of the fourth embodiment to the fifth embodiment.

Figure 38:
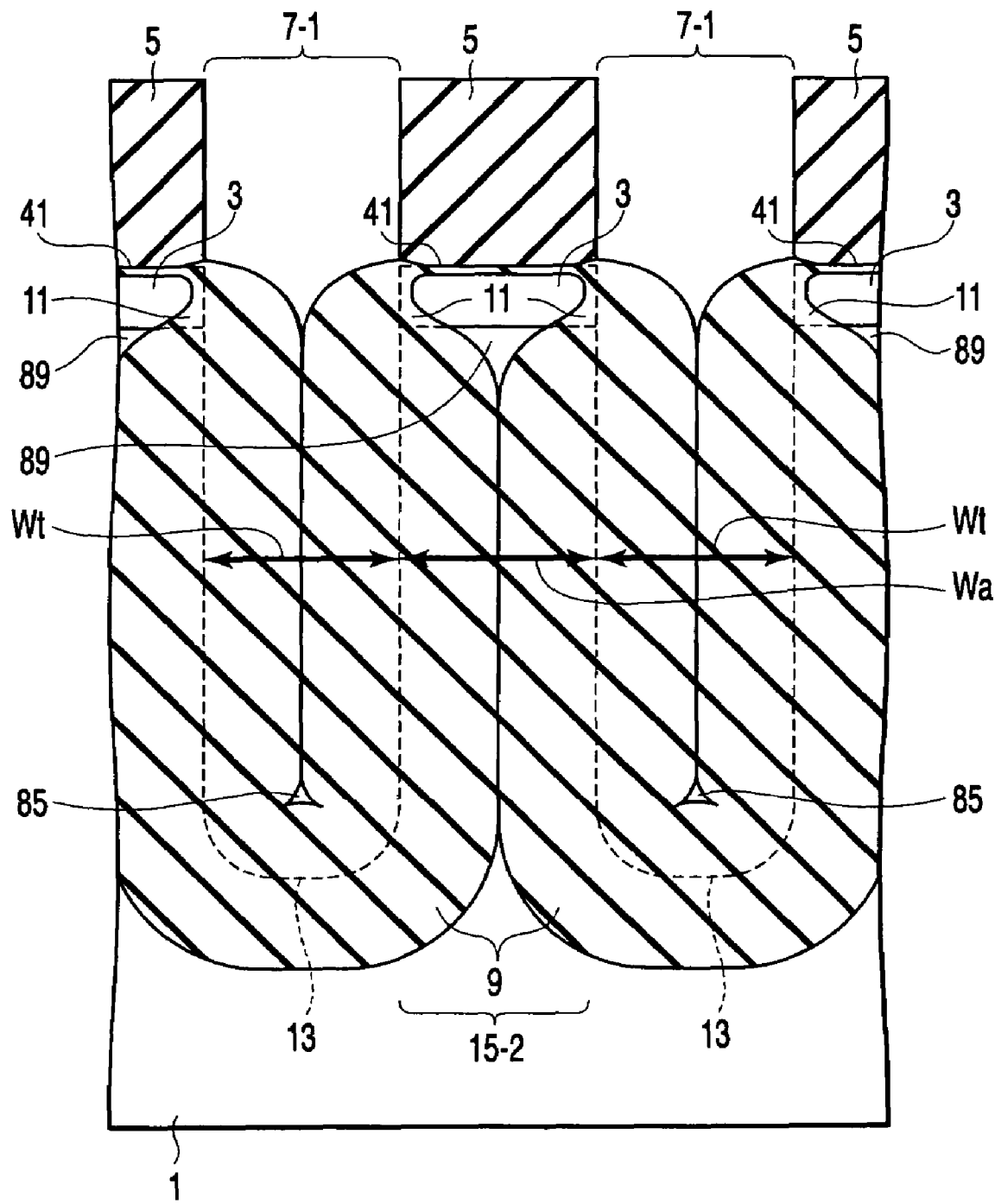
FIG. 38 is a cross sectional view showing one example of a semiconductor device according to a sixth embodiment of this invention.

FIG. 38 is a cross sectional view showing one example of a semiconductor device according to the sixth embodiment of this invention.

As shown in FIG. 38, SiGe layers 89 can be left behind under Si layers 3 by applying the strained SOI structure of the fourth embodiment to the fifth embodiment. Like the fifth embodiment, the advantage of this structure is that the Si layer 3 is formed in contact with the SiGe layer 89, thereby retaining the advantage attained by the "strained semiconductor".

As shown in the sixth embodiment, the fifth embodiment can be combined with the fourth embodiment. Naturally, the fifth embodiment can be combined not only with the fourth embodiment but also with any other embodiment.

Seventh Embodiment

The seventh embodiment is another example of the strained SOI structure.

Figure 39:
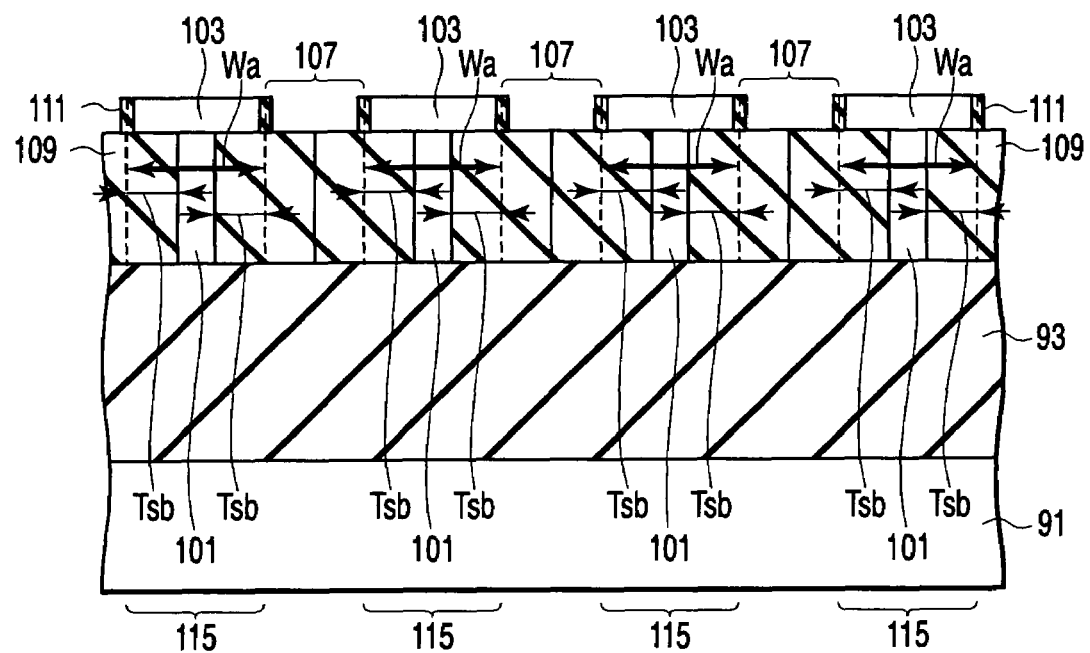
FIG. 39 is a cross sectional view showing one example of a semiconductor device according to a seventh embodiment of this invention.
Figure 40:
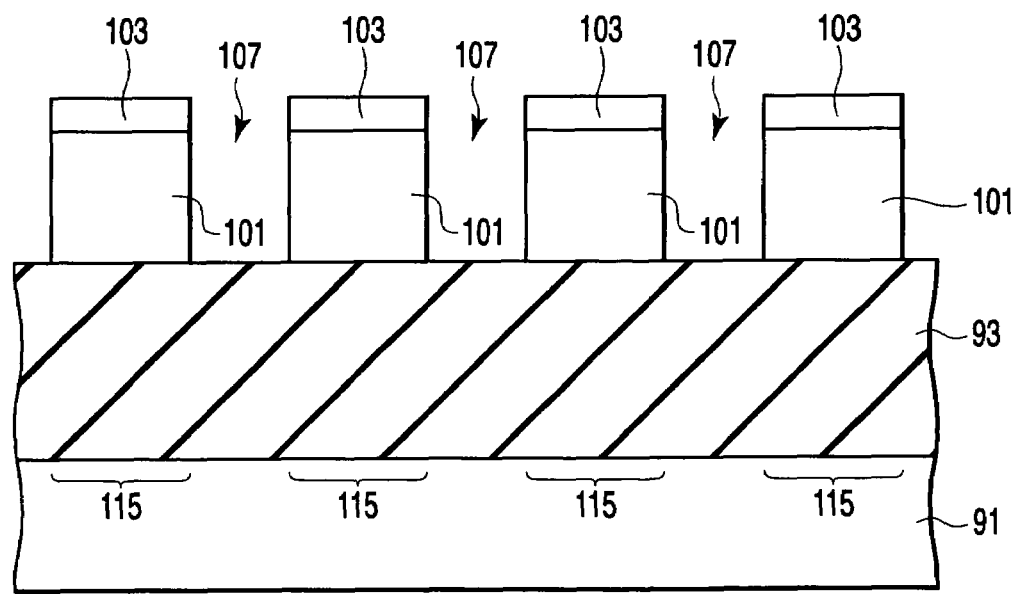
FIG. 40 is a cross sectional view showing one step of a manufacturing process of the semiconductor device according to the seventh embodiment of this invention.

FIG. 39 is a cross sectional view showing one example of a semiconductor device according to the seventh embodiment of this invention and FIG. 40 is a cross sectional view showing one step of a manufacturing process of the semiconductor device according to the seventh embodiment.

As shown in FIGS. 39 and 40, an insulating substrate 93 is formed on a substrate 91. An SiGe layer 101 is formed on the insulating substrate 93. An Si layer 103 is formed on the SiGe layer 101. The SiGe layer 101 and Si layer 103 have trenches 107 formed therein to define active regions 115. Surface portions of the SiGe layer 101 and Si layer 103 which are exposed to the trenches 107 are oxidized to form SiGe oxides 109 and Si oxides 111. Like the first to third embodiments, the relation with respect to the width "Wa" of the active region 115 is set to "Wa>(Tsb×2)". Therefore, the SiGe layer 101 is left behind under the Si layer 103. However, since the Si layer 103 and SiGe layer 101 are formed on the insulating substrate 93, the structure of the seventh embodiment is a strained SOI structure.

Like the sixth embodiment, for example, the advantage of the seventh embodiment is that both of the advantage by the SOI structure and the advantage shown in the first, third and fifth embodiments can be maintained and the SiGe layer which tends to contain faults can be made thin since the SiGe layer 101 is left behind under the Si layer 103.

It is possible to use the strained SOI structure as shown in the seventh embodiment.

As described above, this invention is explained by use of several embodiments, but this invention is not limited to the above embodiments. When embodying this invention, this invention can be variously modified without departing from the technical scope thereof.

Further, the above embodiments can be independently realized, but it is of course possible to appropriately combine and realize the above embodiments.

In addition, the above embodiments contain inventions of various stages, thus it is possible to extract the inventions of various stages by appropriately combining a plurality of constituents disclosed in the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    forming a second semiconductor layer which has less susceptibility to adopting insulative characteristics than a first semiconductor layer on the first semiconductor layer;
    forming grooves in the first and second semiconductor layers; and
    changing portions of the first and second semiconductor layers which are exposed to the grooves into an insulator form to fill the grooves with the insulator-form portions of the first semiconductor layer, wherein the insulator-form portions of the first semiconductor layer contact each other so as to close an upper portion of the groove.

2. The semiconductor device manufacturing method according to claim 1, wherein the process of forming the insulator-form portion is oxidizing.

3. The semiconductor device manufacturing method according to claim 1, wherein a lattice constant of the first semiconductor layer is larger than a lattice constant of the second semiconductor layer.

4. The semiconductor device manufacturing method according to claim 1, wherein a void is provided in the insulator-form portions of the first semiconductor layer.

5. The semiconductor device manufacturing method according to claim 1, wherein the thickness of the insulator-form portions of the first semiconductor layer is substantially constant in the groove.

6. The semiconductor device manufacturing method according to claim 2, wherein the oxidizing is hydrochloric acid oxidation.

7. The semiconductor device manufacturing method according to claim 3, wherein the first semiconductor layer is formed of $Si_xGe_y$, and the second semiconductor layer is formed of Si.

8. A semiconductor device manufacturing method comprising:
   forming a second semiconductor layer which has less susceptibility to adopting insulative characteristics than a first semiconductor layer on the first semiconductor layer;
   forming grooves in the first and second semiconductor layers and form fin-shaped semiconductor structures which are each sandwiched between the grooves; and
   changing portions of the first and second semiconductor layers which are exposed to the grooves into an insulator form to fill the grooves in the first semiconductor layer with the insulator-form portions of the first semiconductor layer, cover the first semiconductor layer in each of the fin-shaped semiconductor structures with the insulator-form portion of the first semiconductor layer and isolate the second semiconductor layer on the insulator-form portion of the first semiconductor layer,
   wherein the second semiconductor prows toward the grooves in a lateral direction while changing into the insulator form.

9. The semiconductor device manufacturing method according to claim 8, wherein the process of forming the insulator-form portion is oxidizing.

10. The semiconductor device manufacturing method according to claim 8, wherein a lattice constant of the first semiconductor layer is larger than a lattice constant of the second semiconductor layer.

11. The semiconductor device manufacturing method according to claim 8, wherein a void is provided in the insulator-form portions of the first semiconductor layer.

12. The semiconductor device manufacturing method according to claim 8, wherein the groove in the first semiconductor layer is filled up with the insulator-form portions of the first semiconductor layer.

13. The semiconductor device manufacturing method according to claim 9, wherein the oxidizing is hydrochloric acid oxidation.

14. The semiconductor device manufacturing method according to claim 10, wherein the first semiconductor layer is formed of $Si_xGe_y$ and the second semiconductor layer is formed of Si.

* * * * *